(12) United States Patent
Moddel et al.

(10) Patent No.: US 6,563,185 B2
(45) Date of Patent: May 13, 2003

(54) HIGH SPEED ELECTRON TUNNELING DEVICE AND APPLICATIONS

(75) Inventors: Garrett Moddel, Boulder, CO (US); Blake J. Eliasson, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 0 days.

(21) Appl. No.: 09/860,972

(22) Filed: May 21, 2001

(65) Prior Publication Data

US 2002/0175273 A1 Nov. 28, 2002

(51) Int. Cl.[7] ................................. H01L 29/82
(52) U.S. Cl. ........................ 257/425; 257/661
(58) Field of Search .................. 257/425, 14, 661, 257/75, 25, 28; 307/311; 343/700; 250/338.1; 331/107 T; 385/49

(56) References Cited

U.S. PATENT DOCUMENTS

| | | | | |
|---|---|---|---|---|
| 4,973,858 A | * | 11/1990 | Chang | ................ 307/311 |
| 5,018,000 A | | 5/1991 | Yamada et al. | |
| 5,019,530 A | | 5/1991 | Kleinsasser et al. | |
| 5,302,838 A | * | 4/1994 | Roenker et al. | ............ 257/14 |
| 5,326,984 A | | 7/1994 | Rosencher et al. | |
| 5,455,451 A | * | 10/1995 | Usagawa et al. | ........... 257/661 |
| 5,543,652 A | * | 8/1996 | Ikeda et al. | .............. 257/377 |
| 5,606,177 A | * | 2/1997 | Wallace et al. | ............. 257/75 |
| 5,825,049 A | * | 10/1998 | Simmons et al. | ............ 257/25 |
| 5,883,549 A | * | 3/1999 | De Los Santos | ......... 331/107 T |
| 5,895,934 A | * | 4/1999 | Harvey et al. | .............. 257/49 |
| 6,049,308 A | * | 4/2000 | Hietala et al. | ............. 343/700 |
| 6,195,485 B1 | * | 2/2001 | Coldren et al. | .............. 385/49 |
| 6,211,531 B1 | * | 4/2001 | Nakazato et al. | ............. 257/28 |
| 6,284,557 B1 | | 9/2001 | Yiu et al. | |
| 6,329,655 B1 | * | 11/2001 | Jack et al. | ............... 250/338.1 |

OTHER PUBLICATIONS

John G. Simmons, Electric Tunnel Effect between Dissimilar Electrodes Separated by a Thin Insulating Film, Sep. 1993, Journal of Applied Physics, V34, p 2581.

S. R. Pollack and C. E Morris, Electron Tunneling through Asymmetric Films of Thermally Grown $Al_2O_3$, May 1964, Journal of Applied Physics, V35, N5, pp. 1503–1513.

L. O. Hocker, D. R. Sokoloff, V. Daneu, A. Szoke, and A. Javan, Frequency Mixing in the Infrared and Far–Infrared using a Metal–to–Metal Point Contact Diode, Jun. 15, 1968, American Institute of Physics, V 12, N 12, pp. 401–402.

(List continued on next page.)

Primary Examiner—Hoai Ho
Assistant Examiner—Thinh Nguyenlo
(74) Attorney, Agent, or Firm—Stephen C. Shear; Yoriko Morita

(57) ABSTRACT

A detector for detecting electromagnetic radiation incident thereon over a desired range of frequencies exhibits a given responsivity and includes an output and first and second non-insulating layers, which layers are spaced apart such that a given voltage can be applied thereacross. The first non-insulating layer is formed of a metal, and the first and second non-insulating layers are configured to form an antenna structure for receiving electromagnetic radiation over the desired range of frequencies. The detector further includes an arrangement disposed between the first and second non-insulating layers and configured to serve as a transport of electrons between the first and second non-insulating layers as a result of the electromagnetic radiation being received at the antenna structure. The arrangement includes at least a first layer of an amorphous material such that the transport of electrons includes, at least in part, transport by means of resonant tunneling, and such that at least a portion of the electromagnetic radiation incident on the antenna is converted at the output to an electrical signal having an intensity which depends on the given responsivity.

80 Claims, 14 Drawing Sheets

OTHER PUBLICATIONS

S. M. Faris, T. Kenneth Gustafson, and John C. Wiesner, Detection of Optical Infrared Radiation with DC–Biased Electron–Tunneling Metal–Barrier–Metal Diodes, Jul. 1973, IEEE Journal of Quantum Electronics, V QE–9, N 7, pp. 737–745.

C. Fumeaux, W. Herrmann, F. K. Kneubuhl, and H. Rothuizen, Nanometer Thin–Film Ni–NiO–Ni Diodes for Detection and Mixing of 30 THz Radiation, Jul. 1998, Infrared Physics and technology, V 39, 123–183.

B. Michael Kale, Electron Tunneling Devices in Optics, Mar. 1985, Optical Engineering, V 24, N 2, pp. 267–274.

G. Papp, M. DiVentra, C. Coluzza, A. Baldereschi, and G. Margaritondo, Current Rectification through a Single–Barrier Resonant Tunneling Quantum Structure, 1995, Superlattices and Microstructures, V 17, N 3, pp. 273–275.

Alexander Korotkov and Konstantin Likharev, Resonant Fowler–Nordheim Tunneling through Layered Tunnel Barriers and its Possible Applications, Mar. 1999, International Electron Device Meeting Technical Digest.

T. Suemasu et al, Metal ($CoSi_2$)/Insulator ($CaF_2$) Resonant Tunneling Diode, Jan. 1994, Jpn. Journal of Applied Physics, V 33, pp. 57–65.

M. Asada, K. Osada, and W. Saitoh, Theoretical Analysis and Fabrication of Small Area Metal/Insulator Resonant Tunneling Diode Integrated with Patch Antenna for Terahertz Photon Assisted Tunneling, 1998, Solid State Electronics, V 42, N7–8, pp. 1543–1546.

Aleksanyan et al, Feasibility of Developing a Tunable Oscillator Utilizing a System of Metal–Barrier–Metal–Barrier–Metal Junctions, May 1981, Sov. J Quantum Electron, vol. 11, No. 5, pp. 635–637.

Aleksanyan et al, Generation of Electromagnetic Oscillations in Metal–Barrier–Metal–Barrier–Metal Structures, Aug. 1982, Sov. J. Quantum Electron., vol. 12, No. 8, pp. 1090–1092.

Belenov et al, Amplification of Plasma Oscillations in Complex Metal–Barrier–Metal Structures, Jul. 1982, Sov. J. Quantum Electron., vol. 12, No. 7, pp. 930–931.

Belenov et al, Investigation of the Radiation Emitted by Metal–Barrier–Metal Structures, Apr. 1983, Sov. J. Quantum Electron., vol. 13, No. 4, pp. 451–455.

Belenov et al, Angular Distribution of the Luminescence Emitted by a Metal–Barrier–Metal Diode, May 1985, Sov. J. Quantum Electron., vol. 15, No. 5, pp. 735–737.

Belenov et al, Resonant Tunneling in Multilayer Structures in the Presence of Surface Electromagnetic Waves, Apr. 1986, Sov. Tech. Phys. Lett., vol. 12, No. 4, pp. 200–202.

Belenov et al, Emission of Surface Electromagnetic Waves in the Case of Resonance Tunneling of Electrons, Oct. 1987, Sov. J. Quantum Electron., vol. 17, No. 10, pp. 1348–1352.

Bykovskii et al, Influence of the Boundary of a Metal Film on the Luminescence Intensity from a Metal–Barrier–Metal Structure, Sov. Phys. Tech. Phys., Aug. 1986, vol. 31, No. 8, pp. 980–981.

* cited by examiner

HIGH SPEED ELECTRON TUNNELING DEVICE AND APPLICATIONS

BACKGROUND OF THE INVENTION

The present invention relates generally to optical devices and, more particularly, to optoelectronic devices based on electron tunneling.

The increasing speed of optical communications is fueling the race to achieve ever faster optical communications devices for transmitting, modulating and detecting electromagnetic signals. Terahertz speeds are expected in the near future, and optical communication devices that can operate at such high speeds are in great demand.

A possible approach to achieving high speed optoelectronic devices for use as optical communication devices is electron tunneling. Electron tunneling-based devices, such as metal-insulator-metal (M-I-M) devices for use as infrared and far-infrared detectors and frequency mixers have been explored in the past (see, for example, S. M. Faris, et al., "Detection of optical and infrared radiation with DC-biased electron-tunneling metal-barrier-metal diodes," *IEEE Journal of Quantum Electronics*, vol. QE-9, no. 7 (1973); L. O. Hocker, et al., "Frequency mixing in the infrared and far-infrared using a metal-to-metal point contact diode," *Applied Physics Letters*, vol. 12, no. 12 (1968); and C. Fumeaux, et al., "Nanometer thin-film Ni—NiO—Ni diodes for detection and mixing of 30 THz radiation," *Infrared Physics and Technology*, 39 (1998)). Such M-I-M devices generally operate on the basis of electron rectification and current production due to incident electromagnetic energy and resulting electron tunneling effects. M-I-M devices can normally be used to rectify extremely high frequencies, extending into the optical frequency range.

In addition to high frequency rectification, it is also desirable to achieve high degrees of asymmetry and nonlinearity in the current-versus-voltage (I-V) curve in electron tunneling devices. The differential resistance of the device, which corresponds to the sensitivity of the device to incoming electromagnetic energy, is directly related to the nonlinearity of the I-V curve. However, prior art M-I-M devices generally exhibit low degrees of asymmetry and nonlinearity in the electron transport such that the efficiency of such devices is limited. A high degree of nonlinearity improves the quantum efficiency of the electron tunneling device, which is number of electrons collected for each photon incident on the M-I-M device. High quantum efficiency is crucial for efficient operation and high sensitivity of the M-I-M diode in all optoelectronic applications. For purposes of this application, a diode is defined as a two-terminal device. A high degree of nonlinearity offers specific advantages in certain applications. For example, in optical mixing, second order derivatives of the current-voltage relationship determine the magnitude of the signal produced in frequency down-conversion. A higher degree of asymmetry in the I-V curve between positive values of V (forward bias voltage) and negative values of V (reverse bias voltage) results in better rectification performance of the device. A high degree of asymmetry is required, for example, to achieve efficient large signal rectification such as in the detection of high intensity incident fields. In this high intensity field regime, the electron tunneling device functions as a switch, and it is desirable to attain a low resistance value in one polarity of voltage and a high resistance value in the opposite polarity of voltage is desired. Alternatively, with low field intensities and large photon energies, the incident field sweeps a larger portion of the electron tunneling device dark I-V curve and, consequently, the high asymmetry translates into high responsivity and as well as high quantum efficiency and sensitivity in electromagnetic radiation detection.

The fabrication of the combinations of alternate layers of metals and insulators in M-I-M-based devices, in comparison to semiconductor materials, is advantageous due to ease of deposition of materials relative to semiconductor fabrication. It has been suggested that the recent trend of decreasing the size of electronic devices to achieve high speed switching will ultimately make semiconductor-based devices impractical due to fluctuation of carrier concentration, which occurs when semiconductor devices are reduced to mesoscopic regimes (see, for example, Suemasu, et al, "Metal ($CoSi_2$)/Insulator($CaF_2$) resonant tunneling diode," *Japanese Journal of Applied Physics*, vol. 33 (1994), hereafter Suemasu). Moreover, semiconductor devices are generally single bandgap energy devices. This characteristic of semiconductor devices means that, in detection applications, no current is produced when a photon having energy less than the bandgap energy is incident on the semiconductor device. In other words, the response of the semiconductor device is limited by the bandgap energy. When a semiconductor diode is used to rectify high frequency oscillations, the semiconductor material limits the frequency response of the diode because the charge carriers must be transported through a band, in which concentration are limited in comparison to a metal.

Existing electron tunneling devices based on metal-oxide combinations are generally fabricated by forming a metal layer, exposing the metal layer for a certain amount of time such that the native oxide of the metal is formed, then repeating the process as desired. Photolithography techniques may also be used to achieve desired shapes and patterns in the metals and insulators. For example, Suemasu describes a metal ($CoSi_2$)/insulator($CaF_2$) resonant tunneling diode with a configuration M-I-M-I-M-I-M triple-barrier structure for use as long wavelength (far-infrared and milliwave) detectors and emitters. However, the M-I-M-I-M-I-M device of Suemasu is much more complicated than the simple M-I-M devices, and must be fabricated using a complex epitaxial growth procedure using exotic materials. In fact, Suemasu chooses to use the triple-barrier structure rather than a slightly simpler double-barrier structure for apparently better performance results in the electron tunneling process. Therefore, although the M-I-M-I-M-I-M device of Suemasu achieves much higher degrees of asymmetry and nonlinearity in the I-V curve than the M-I-M devices, the performance gains come at the cost of the simplicity in design and fabrication.

An alternative approach is the use of a combination of a metal and a semiconductor in a metal-insulator-semiconductor (MIS) configuration (see, for example, T. Yamada, et al., "Semiconductor Device Using MIS Capacitor," U.S. Pat. No. 5,018,000, issued May 21, 1991). The drawback to currently available MIS devices is also the limited efficiency due to asymmetry and nonlinearity limitations. MIS devices cannot operate at as high frequencies as M-I-M devices because the concentration of electron states in the semiconductor is lower than that from a metal.

At this time, infrared detectors, for example, capable of receiving electromagnetic signal at terahertz rates, at room temperature, are not readily available, to the Applicants' knowledge. Temperature-controlled alternatives, such as narrow bandgap semiconductor detectors, and bolometers, exist on the market, but the extra considerations associated with the temperature control mechanism make such devices expensive and bulky. Prior art M-I-M detectors are capable of detecting infrared radiation without cooling, but these prior art detectors are not sensitive enough for practical applications.

As will be seen hereinafter, the present invention provides a significant improvement over the prior art as discussed above by virtue of its ability to provide the increased performance while, at the same time, having significant advantages in its manufacturability.

SUMMARY

As will be described in more detail hereinafter, a number of high speed electron tunneling devices are disclosed herein. The devices of the present invention are especially distinguishable from the aforementioned electron tunneling devices of the prior art by the implementation of resonant tunneling using at least one layer of an amorphous material in the devices. In a first aspect of the invention, a detector for detecting electromagnetic radiation incident thereon is disclosed. The detector has an output, exhibits a given responsivity and includes first and second non-insulating layers spaced apart from one another such that a given voltage can be applied across the first and second non-insulating layers, the first non-insulating layer being formed of a metal, and the first and second non-insulating layers being configured to form an antenna structure for receiving electromagnetic radiation. The detector further includes an arrangement disposed between the first and second non-insulating layers and configured to serve as a transport of electrons between the first and second non-insulating layers as a result of the electromagnetic radiation being received at the antenna structure. This arrangement includes a first layer of an amorphous material and a second layer of material, configured to cooperate with the first layer of the amorphous material such that the transport of electrons includes, at least in part, transport by tunneling, and such that at least a portion of the electromagnetic radiation incident on the antenna is converted to an electrical signal at the output, the electrical signal having an intensity which depends on the given responsivity. For purposes of this application, an amorphous material is considered to include all materials which are not single crystal in structure.

In a second aspect of the invention, an emitter for providing electromagnetic radiation of a desired frequency at an output is described. The emitter includes a voltage source, for providing a bias voltage, and first and second non-insulating layers, which non-insulating layers are spaced apart from one another such that the bias voltage can be applied across the first and second non-insulating layers. The emitter also includes an arrangement disposed between the first and second non-insulating layers and configured to serve as a transport of electrons between the first and second non-insulating layers as a result of the bias voltage. This arrangement is configured to exhibit a negative differential resistance when the bias voltage is applied across the first and second non-insulating layers. The arrangement includes a first layer of an amorphous material and a second layer of material, which second layer of material is configured to cooperate with the first layer of amorphous material such that the transport of electrons includes, at least in part, transport by means of tunneling, and such that an oscillation in the transport of electrons results. This oscillation has an oscillation frequency equal to the desired frequency, due to the negative differential resistance, and causes an emission of electromagnetic radiation of the desired frequency at the output.

In a third aspect of the invention, a modulator for modulating an input electromagnetic radiation incident thereon and providing a modulated electromagnetic radiation at an output is described. The modulator includes a voltage source for providing a modulation voltage, which modulation voltage is switchable between first and second voltage values. The modulator also includes first and second non-insulating layers spaced apart from one another such that the modulation voltage can be applied across the first and second non-insulating layers. The first and second non-insulating layers are configured to form an antenna structure for absorbing a given fraction of the input electromagnetic radiation with a given value of absorptivity, while a remainder of the input electromagnetic radiation is reflected by the antenna structure, where absorptivity is defined as a ratio of an intensity of the given fraction to a total intensity of the input electromagnetic radiation. The modulator further includes an arrangement disposed between the first and second non-insulating layers and configured to serve as a transport of electrons between the first and second non-insulating layers as a result of the modulation voltage. This arrangement includes a first layer of an amorphous material and a second layer of material, which second layer of material is configured to cooperate with the first layer of the amorphous material such that the transport of electrons includes, at least in part, transport by means of tunneling, with respect to the modulation voltage. The arrangement is configured to cooperate with the first and second non-insulating layers such that the antenna exhibits a first value of absorptivity, when modulation voltage of the first voltage value is applied across the first and second non-insulating layers, and exhibits a distinct, second value of absorptivity, when modulation voltage of the second voltage value is applied across the first and second non-insulating layers, causing the antenna structure to reflect a different amount of the input electromagnetic radiation to the output as modulated electromagnetic radiation, depending on the modulation voltage. The modulator is configurable to operate as a digital device, in which only discrete, first and second voltage values are used, or as an analog device, in which continuous values of voltage between the aforedescribed first and second voltage values are used to achieve a continuum of values of absorptivity between the aforementioned first and second values of absorptivity.

In a fourth aspect of the present invention, a modulator assembly for receiving a modulation signal, modulating an input electromagnetic radiation and providing an output electromagnetic radiation is described. The modulator assembly includes a voltage source for providing a bias voltage, and first and second non-insulating layers, which non-insulating layers are spaced apart from one another such that the bias voltage can be applied across the first and second non-insulating layers. The first and second non-insulating layers are also configured to form a first antenna structure for receiving the modulation signal and converting the modulation signal so received into a modulation voltage, which modulation voltage is also applied across the first and second non-insulating layers. The modulator assembly also includes an arrangement disposed between the first and second non-insulating layers and configured to serve as a transport of electrons between the first and second non-insulating layers as a result of the modulation voltage. The arrangement includes a first layer of an amorphous material and a second layer of material, which second layer of material is configured to cooperate with the first layer of the amorphous material such that the transport of electrons includes, at least in part, transport by means of tunneling. The modulator assembly further includes a second antenna structure having an absorptance value, which absorptance value depends on the aforementioned modulation voltage. The second antenna structure is configured to receive and selectively absorb the input electromagnetic radiation in proportion to the absorptance value so as to produce the output electromagnetic radiation.

In an fifth aspect of the present invention, a field effect transistor for receiving an external signal, switching an input signal according to the received, external signal and providing an output signal is described. The external signal is switchable between a first value and a second value, and the field effect transistor includes a diode structure including a source electrode for receiving the input signal and a drain electrode spaced apart from the source electrode such that a given voltage can be applied across the source and drain electrodes. The diode structure further includes an arrangement disposed between the source and drain electrodes and configured to serve as a transport of electrons between the source and drain electrodes. The arrangement includes at least a first layer of an amorphous material configured such that the transport of electrons includes, at least in part, transport by means of resonant tunneling with a given value of a tunneling probability. The field effect transistor also includes a shielding layer at least partially surrounding the diode structure. The field effect transistor further includes a gate electrode disposed adjacent to the shielding layer and is configured to receive the external signal and to apply the external signal as the given voltage across the source and drain electrodes such that, when the first value of external signal is received at the gate electrode, a first signal value is provided as the output signal at the drain electrode and, when the second value of external signal is received at the gate electrode, a second signal is provided as the output signal at the drain electrode.

In a sixth aspect of the present invention, a junction transistor is described. The junction transistor includes an emitter electrode and a base electrode, which is spaced apart from the emitter electrode such that a given voltage can be applied across the emitter and base electrodes and, consequently, electrons are emitted by the emitter electrode toward the base electrode. The junction transistor also includes a first tunneling structure disposed between the emitter and base electrodes. The first tunneling structure is configured to serve as a transport of electrons between the emitter and base electrodes and includes at least a first layer of an amorphous material configured such that the transport of electrons includes, at least in part, transport by means of resonant tunneling with a tunneling probability. The tunneling probability depends on the given voltage. The junction transistor further includes a collector electrode, which is spaced apart from the base electrode, and a second tunneling structure, which is disposed between the base and collector electrodes. The second tunneling structure is configured to serve as a transport, between the base and collector electrodes, of at least a portion of the electrons emitted by the emitter electrode such that the portion of electrons is collected by the collector electrode with a collection efficiency and the transport of electrons includes, at least in part, transport by means of tunneling.

In a seventh aspect of the present invention, an optoelectronic amplification element is described. The optoelectronic amplification element is formed by combining the aforementioned field effect transistor or junction transistor with a detector coupled to the control electrode and an emitter coupled to an output. The optoelectronic amplification element is configured such that electromagnetic radiation incident upon the detector generates a voltage across the detector and subsequently across the control electrodes of the transistor, base and emitter in the case of the junction transistor. The control voltage across the control electrodes of the transistor in turn controls the bias voltage on the emitting device which may be tuned to emit substantially more electromagnetic radiation than the amount initially incident upon the device.

In an eighth aspect of the present invention, an optoelectronic mixer element for simultaneously receiving at least two distinct frequencies of electromagnetic radiation and producing an output signal having a beat frequency, which beat frequency is a combination of said distinct frequencies is described. The optoelectronic mixer element includes first and second non-insulating layers spaced apart from one another such that a given voltage can be applied across the first and second non-insulating layers. The first and second non-insulating layers are configured to form an antenna structure for receiving electromagnetic radiation of the distinct frequencies. The optoelectronic mixer element further includes an arrangement disposed between the first and second non-insulating layers and configured to serve as a transport of electrons between the first and second non-insulating layers as a result of the two distinct frequencies of electromagnetic radiation being received at the antenna structure. The arrangement includes at least a first layer of an amorphous material such that the transport of electrons includes, at least in part, transport by means of resonant tunneling, and such that at least a portion of the electromagnetic radiation incident on the antenna is converted to the output signal having the beat frequency.

In a ninth aspect of the present invention, an electron tunneling device includes first and second non-insulating layers. The first and second non-insulating layers are spaced apart from one another such that a given voltage can be applied across the first and second non-insulating layers, and the first non-insulating layer is formed of a semiconductor material while the second non-insulating layer is formed of a metal. The electron tunneling device further includes an arrangement disposed between the first and second non-insulating layers and configured to serve as a transport of electrons between the first and second non-insulating layers. This arrangement includes a first layer of an amorphous material such that using only the first layer of amorphous material in the arrangement would result in a given degree of nonlinearity in the transport of electrons, with respect to the given voltage. However, in accordance with a first aspect of the present invention, the arrangement includes a second layer of material, which second layer is configured to cooperate with the first layer of amorphous material such that the transport of electrons includes, at least in part, transport by tunneling, and such that the nonlinearity in the transport of electrons, with respect to the given voltage, is increased over and above the given degree of nonlinearity.

In a tenth aspect of the invention, the first non-insulating layer in the electron tunneling device is formed of a superconductor. The first non-insulating layer in the electron tunneling device can also be formed of a semi-metal or be in a form of a quantum well or a superlattice.

In an eleventh aspect of the invention, the arrangement in the electron tunneling device further includes a third layer of material, which is configured to cooperate with the first layer of the amorphous material and the second layer of material such that the nonlinearity in the transport of electrons, with respect to the given voltage, is further increased over and above the given degree of nonlinearity.

BRIEF DESCRIPTION OF THE DRAWINGS

The present invention may be understood by reference to the following detailed description taken in conjunction with the drawings briefly described below.

DETAILED DESCRIPTION

Still another alternative to the M-I-M, M-I-M-I-M-I-M and MIS devices is disclosed in copending U.S. patent application Ser. No. 09/860,988, which is filed contemporaneously herewith and is incorporated herein by reference. Eliasson discloses an electron tunneling device based on metal-oxide combinations similar to an M-I-M structure but including additional layer of an insulator positioned between the non-insulating layers. The additional layer of Eliasson is configured to increase the nonlinearity, asymmetry and differential resistance exhibited by the resulting device over and above the values of these parameters exhibited by a simple M-I-M device, which does not include the additional layer. The concept of tailoring the layering of the non-insulating and insulating layers within the electron tunneling device can be extended to achieve heretofore unseen optoelectronic devices such as narrowband detectors, emitters, modulators and transistors, including electron tunneling devices. The optoelectronic devices of the present invention differ from the aforementioned electron tunneling devices of the prior art in that the devices of the present invention are characterized by resonance in the tunneling mechanism while using at least one layer of an amorphous material. The optoelectronic devices of the present invention are illustrated in FIGS. 1A-6 and described immediately hereinafter.

Figure 1A:
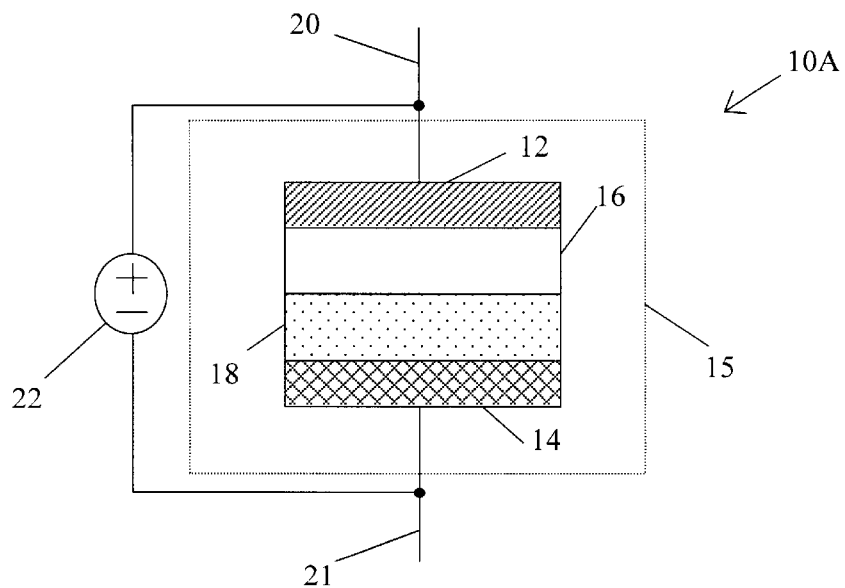
FIGS. 1A–1E are diagrammatic illustrations of high speed, narrowband detectors and a detector array designed in accordance with the present invention.

Turning now to the figures, wherein like reference numbers are used to refer to like components, attention is immediately directed to FIGS. 1A–1E, which illustrate schemes for achieving a narrowband detector based on the electron tunneling device. FIG. 1A shows a detector 10A, which includes a first non-insulating layer 12 and a second non-insulating layer 14, in addition to first and second insulating layers 16 and 18, respectively. First non-insulating layer 12, second non-insulating layer 14, first insulating layer 16 and second insulating layer 18 combine to form a diode structure 15. Detector 10A also includes antennae 20 and 21. Antennae 20 and 21 can be integrally formed from first and second non-insulating layers 12 and 14, respectively, or attached separately thereto. Antennae 20 and 21 are configured to absorb incident electromagnetic energy (not shown) over a specific, narrow range of wavelengths. Detector 10A further includes a voltage source 22 for tuning the characteristics of diode structure 15. In this way, detector 10A achieves a narrow reception bandwidth through the use of antennae 20 and 21 that absorb energy over a narrow range of wavelengths.

Figure 1B:
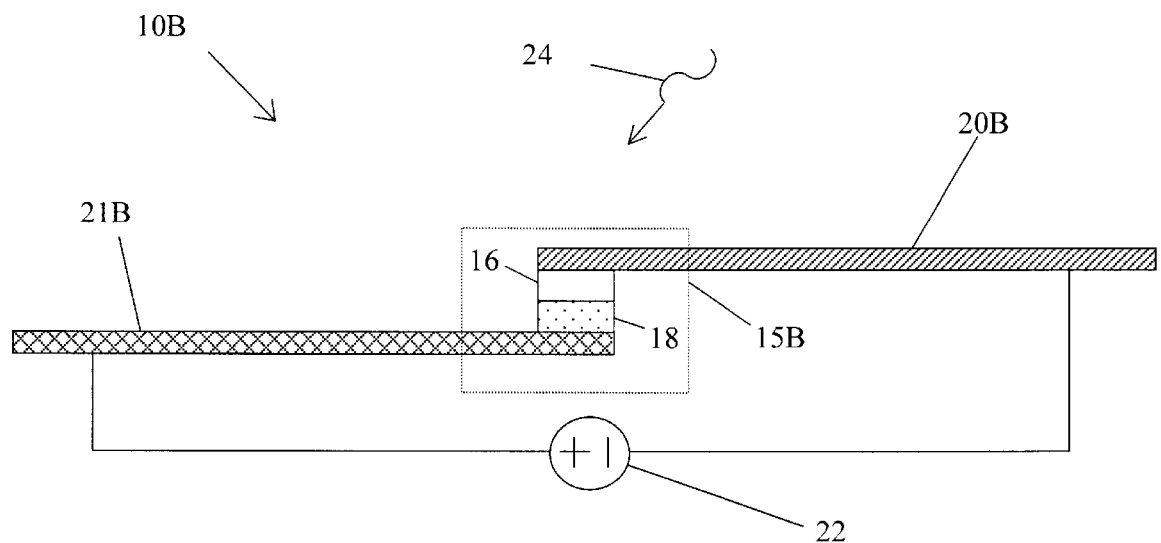

FIG. 1B is an edge view of a narrowband detector 10B of the present invention, shown here to illustrate an embodiment in which diode structure 15B is formed of antennae 20B and 21B as first and second non-insulating layers with first and second insulating layers 16 and 18 disposed therebetween. When electromagnetic radiation 24 is incident on narrowband detector 10B, electromagnetic radiation 24 is received by antennae 20B and 21B. Antennae 20B and 21B are also configured to receive input voltage from voltage source 22 such that the characteristics of diode structure 15B is tunable.

Figure 1C:
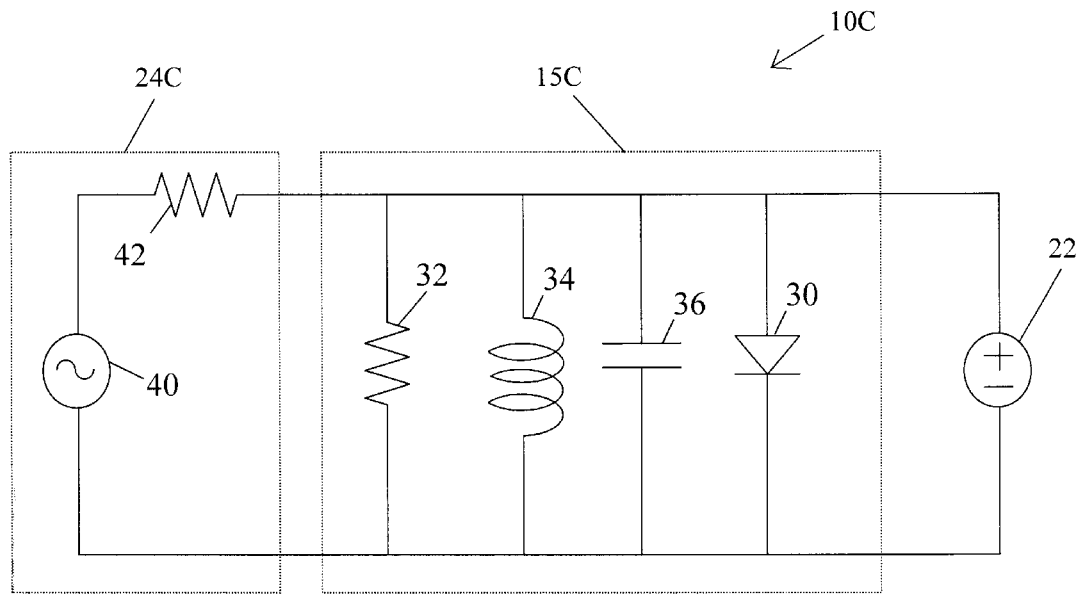
Figure 1D:
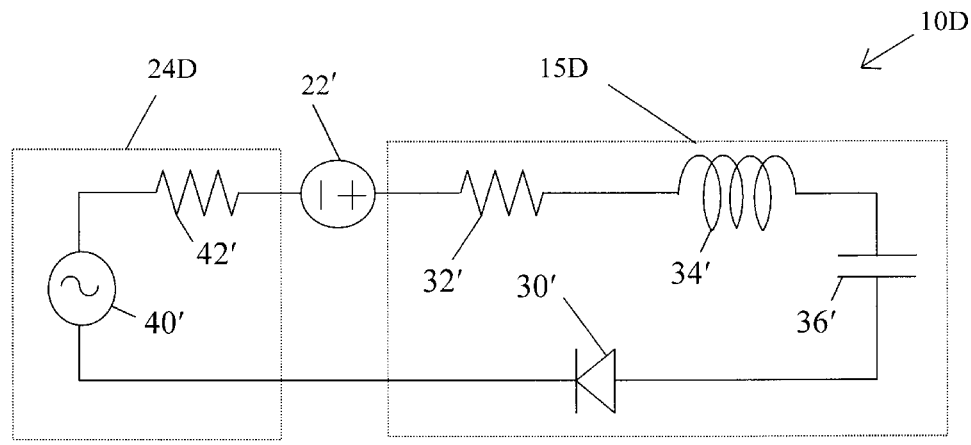

Referring now to FIGS. 1C and 1D in conjunction with FIGS. 1A and 1B, parallel and series RLC circuits 10C and 10D, respectively, equivalent to the narrowband detector of FIG. 1A or 1B are shown. In parallel RLC circuit 10C, a box 15C indicates the collection of parallel components equivalent to diode structure 15 or 15B. Inside box 15C, a diode 30, a resistor 32, an inductor 34 and a capacitor 36 are arranged in parallel as the equivalent circuit representing diode structure 15 or 15B. Voltage source 22 is shown parallel to box 15C, to be consistent with FIGS. 1A and 1B. A box 24C surrounds the components representing the incident radiation (EM source 40) and the antennae (resistor 42). Similarly, in FIG. 1D, serial RLC circuit 10D includes a box 15D indicating the collection of series components equivalent to diode structure 15 or 15B from FIG. 1A or 1B, respectively. A diode 30', a resistor 32', an inductor 34' and a capacitor 36' are positioned in series inside box 15D to represent an equivalent circuit for diode structure 15 or 15B. Again, an EM source 40' and a resistor 42' within box 24D represent the incident radiation and the antennae, respectively, and a voltage source 22' is shown to provide a voltage across diode 30'.

Continuing to refer to FIGS. 1C and 1D, in each case, the equivalent RLC circuit represents components that can be configured into a resonant circuit which responds optimally only to a limited range of frequencies. The component values can be modified, as known to those skilled in the art, to provide response over a desired range of frequencies. For a parallel RLC circuit having a differential resistance $\Delta R$, the oscillation frequency is given by the equation:

$$\omega = \left[\frac{1}{LC} - \frac{1}{(2(\Delta R)C)^2}\right]^{1/2} \quad (1)$$

For a series RLC circuit having a differential resistance $\Delta R$, the oscillation frequency is given by the equation:

$$\omega = \left[\frac{1}{LC} - \frac{(\Delta R)^2}{4L^2}\right]^{1/2} \quad (2)$$

In other words, the RLC circuit works to limit the receiving bandwidth of the detector. This effect is important in limiting the noise bandwidth of the detectors of the present invention.

In particular, for a parallel RLC circuit operating in a region where $\Delta R$ is positive, the oscillation frequency $\omega$ is as given by Equation 1 above. For positive values of $\Delta R$, the oscillation is dampened by an exponential factor $\exp(-1/(\Delta R \, C))$, thus yielding a detection bandwidth of $1/(\Delta R \, C)$ with quality factor $$Q = \frac{1}{\Delta R}\left(\frac{L}{C}\right)^{1/2}.$$

Similarly, for a series RLC circuit operating in a region where $\Delta R$ is positive, the oscillation frequency $\omega$ is as given by Equation 2 above. For positive values of differential resistance $\Delta R$, the oscillation is dampened by an exponential factor $\exp(-\Delta R/2L)$, thus yielding a detection bandwidth of $\Delta R/L$ with quality factor $Q=\Delta R(C/L)^{1/2}$.

The receiving frequency of the narrowband detector of FIG. 1A or 1B is determined by Equation 1 or 2, depending on the physical device. From Equation 1, for small values of L, the 1/LC term again dominates. From Equation 2, for small values of C, the 1/LC term dominates in determining the allowed oscillation frequencies. Changing the $\Delta R$ value provides fine adjustments to the allowed oscillation frequency, and hence the sensitivity off the detector. The fine tuning of the actual detector device of the present invention should take into account both the series and parallel RLC tuning circuit analyses to determine the actual allowed oscillation frequencies.

If the detector is not configured as a resonant circuit, a limitation to its frequency response is its $\Delta RC$ time constant. The capacitance C can be reduced, for example, by modifying the geometry of the device. To further decrease the effective $\Delta RC$ value, the antenna can be configured to add an inductive reactance to the diode, compensating the capacitive reactance. Alternatively, the inductive component may be added physically in parallel with the diode.

Figure 1E:
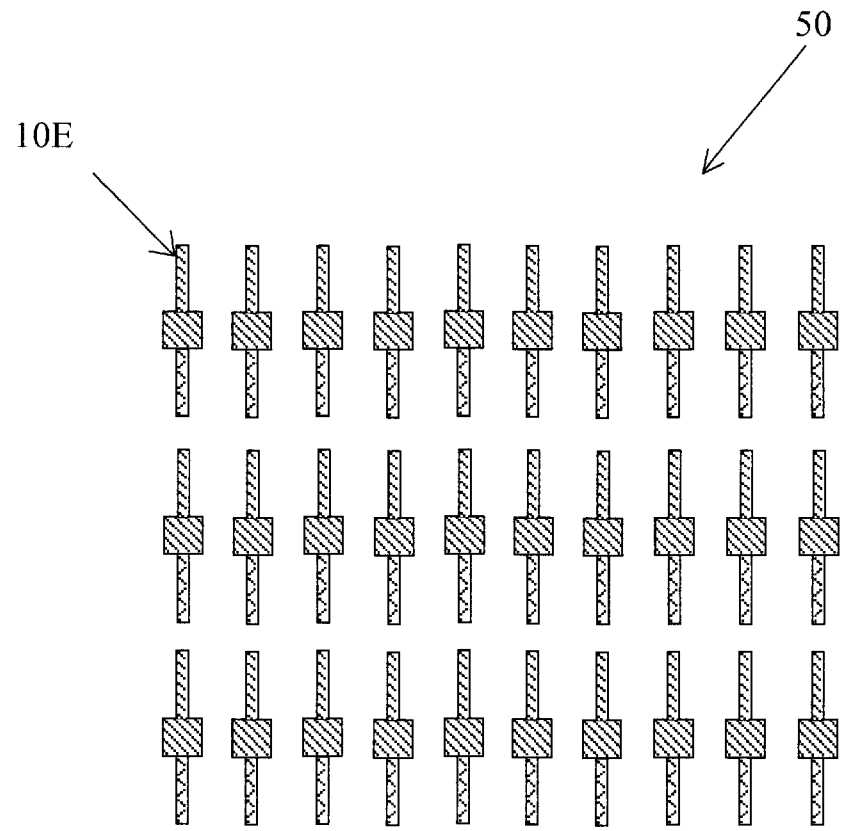

FIG. 1E shows a detector array 50 designed in accordance with the present invention. Detector array 50 includes a plurality of detectors 10E, each of which detectors 10E has a narrowband reception characteristic as described for detector 10A of FIG. 1A (Voltage source 22 of each detector 10A is not shown for simplicity). For example, each detector 10E can be configured as detector 10B of FIG. 1B, in which the antennae are integrally formed from the first and second non-insulating layers forming diode structure 15B. Furthermore, at least some of detectors 10E in detector array 50 can be designed to receive different frequencies of input radiation such that detector array 50 is capable of detecting narrowband radiation over a range of frequencies. Still further, detector array 50 can be configured such that it is capable of detecting radiation over an area larger than the area covered by individual detectors 10E.

The narrowband detector of FIG. 1A can be modified in a number of ways. For example, the antennae of the narrowband detector can be configured to simultaneously receive two or more distinct frequencies of incident electromagnetic radiation. The diode structure of the narrowband detector can be further designed to produce an output electrical signal having a beat frequency, which is the difference between the two incident frequencies. One frequency from a local oscillator may be applied to the antenna, either in the form of electromagnetic radiation or in the form of an applied electrical signal, and a second frequency can be an incident electromagnetic radiation. In this way, the narrowband detector can then be used for heterodyne detection capable of detecting high frequency signals that are faster than the detection capabilities of the electronics through analysis of the beat frequency of the output electrical signal.

Figure 2A:
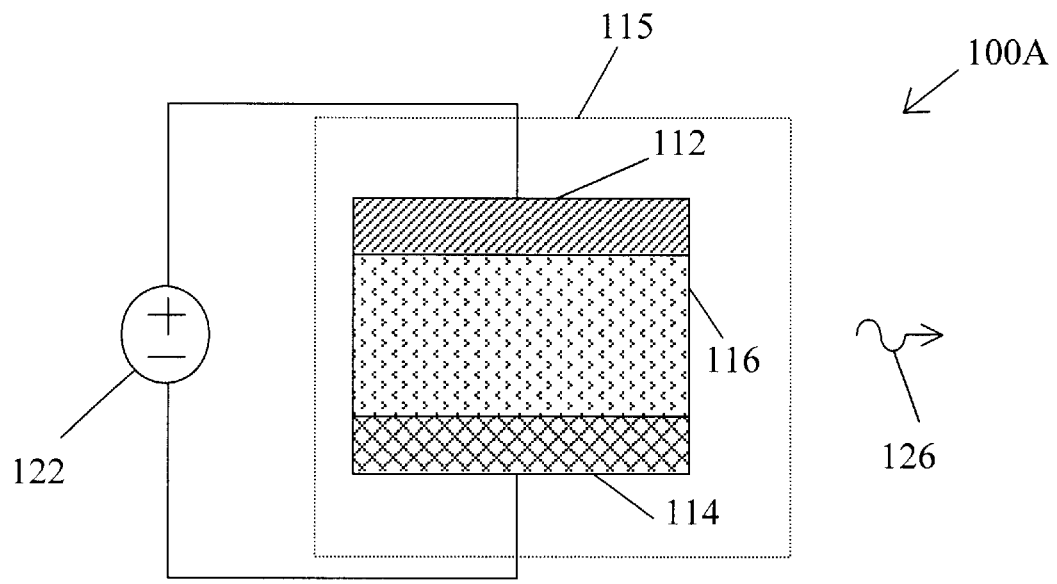
FIGS. 2A–2G are diagrammatic illustrations of high speed emitters and an emitter array designed in accordance with the present invention.

Turning now to FIGS. 2A–2G, high speed emitters based on the modified electron tunneling device of the present invention are illustrated. FIG. 2A shows an emitter 110A, which includes a first non-insulating layer 112 and a second non-insulating layer 114. A multilayer tunneling structure 116 is disposed between first and second non-insulating layers 112 and 114. First non-insulating layer 112, second non-insulating layer 114, and multilayer tunneling structure 116 combine to form a diode structure 115, which directly emits electromagnetic radiation 126. This emission of electromagnetic radiation 126 results from the relaxation of hot electrons (not shown) within diode structure 115 produced directly from an applied voltage from voltage source 122, which includes an intrinsic source impedance (not shown).

Multilayer tunneling structure 116 shown in FIG. 2A can be any suitable structure which results in diode structure 115 being capable of producing electron transport such as, for example, the double insulator structure shown in diode structure 15 shown in FIG. 1A. Other multilayer tunneling structures can also be incorporated into emitter 100A without deviating from the spirit of the present invention. For example, a third insulator layer can be added to the double insulator structure to form an M-I-I-I-M structure. With the selection of a suitable insulator, a quantum well can formed at both of the insulator-insulator interfaces with the application of a proper applied voltage. The addition of this third insulator layer limits the range of applied voltage values which yield appreciable current flow, thus resulting in increased nonlinearity in the current-voltage characteristics of the electron tunneling device. As another example, an additional non-insulating layer as well as an insulator layer such that the device forms the structure M-I-I-M-I-M. The central metal layer can be configured to form a quantum well. This quantum well restricts the energy levels at which electrons can traverse the M-I-I-M-I-M structure, thus resulting increased asymmetry at an optimal value of applied voltage. As still another example, the multilayer structure can be of the form I-M-I-I-M-I-M-M-I-M-I-I such that the overall structure takes the form M-I-M-I-I-M-I-M-M-I-M-I-I-M. In this case, the multilayer produces a specific range of allowed energies for electrons tunneling through the structure which is broader than the range of energies allowed by the inclusion of a single isolated quantum well. In this way, the range of voltages at which resonant tunneling takes place can be tailored for a desired application.

Figure 2B:
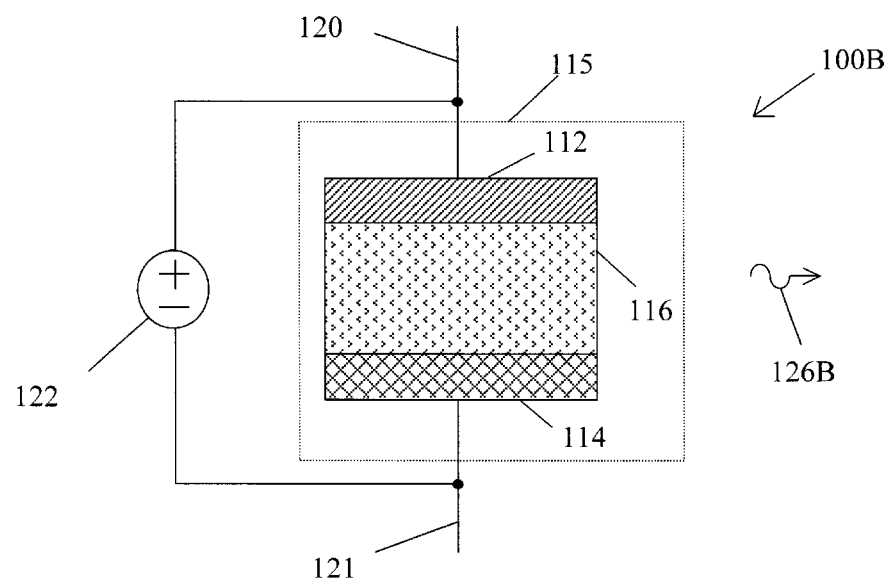

FIG. 2B illustrates another emitter 100B designed in accordance with the present invention. Emitter 100B is similar in structure to emitter 100A of FIG. 2A but further includes antennae 120 and 121. In the case of emitter 100B, the applied voltage from voltage source 122, or applied current (not shown), biases diode structure 115 in a region of negative differential resistance, resulting in electronic resonance effects. This resonance causes the electron transport between the antennae to oscillate rapidly, thus resulting in the emission of electromagnetic radiation from the antennae.

Figure 2C:
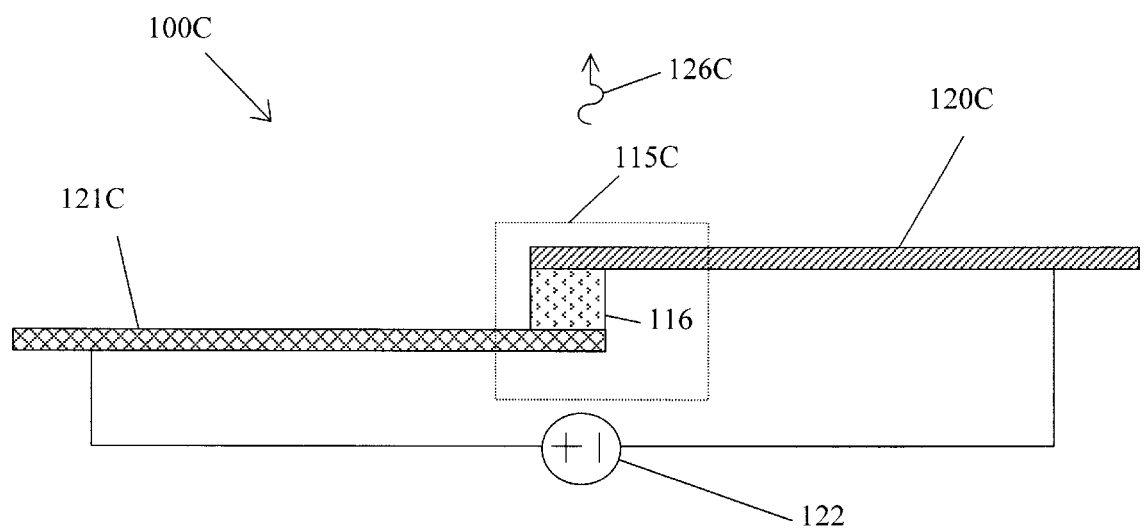

FIG. 2C is an edge-view of an emitter 100C of the present invention, shown here to illustrate an embodiment in which diode structure 115C is formed of antennae 120C and 121C as first and second non-insulating layers with multilayer tunneling structure 116 disposed therebetween. When a voltage is applied across diode structure 115C by voltage source 122 such that the diode structure is biased in a region of negative differential resistance, emitter 100C emits electromagnetic radiation from the antennae due to electronic resonance.

Figure 2D:
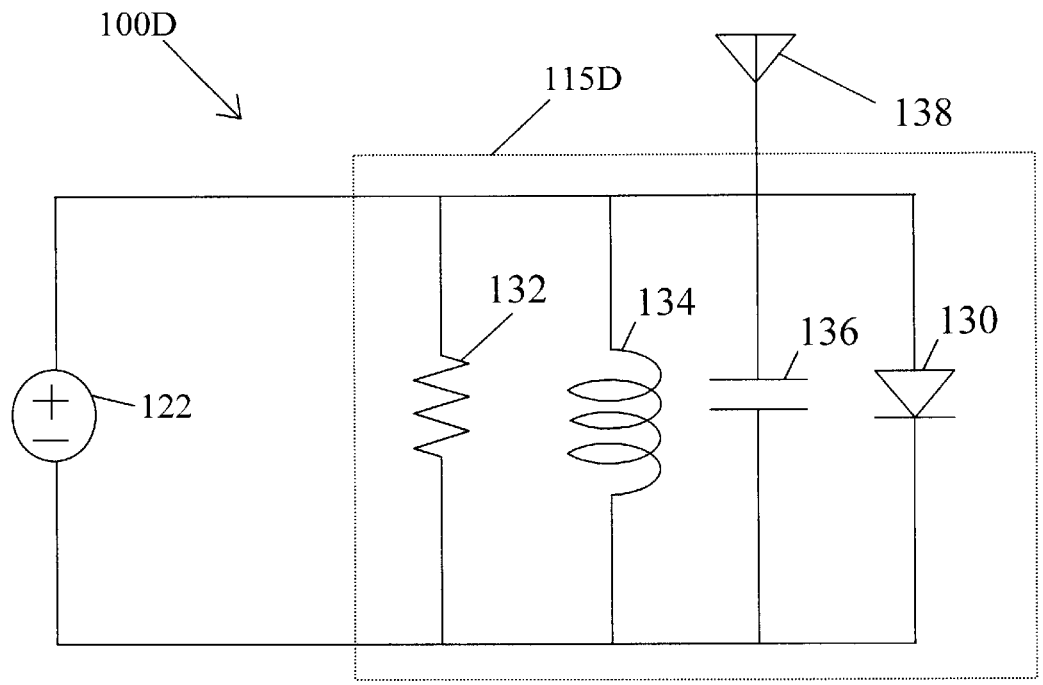
Figure 2E:
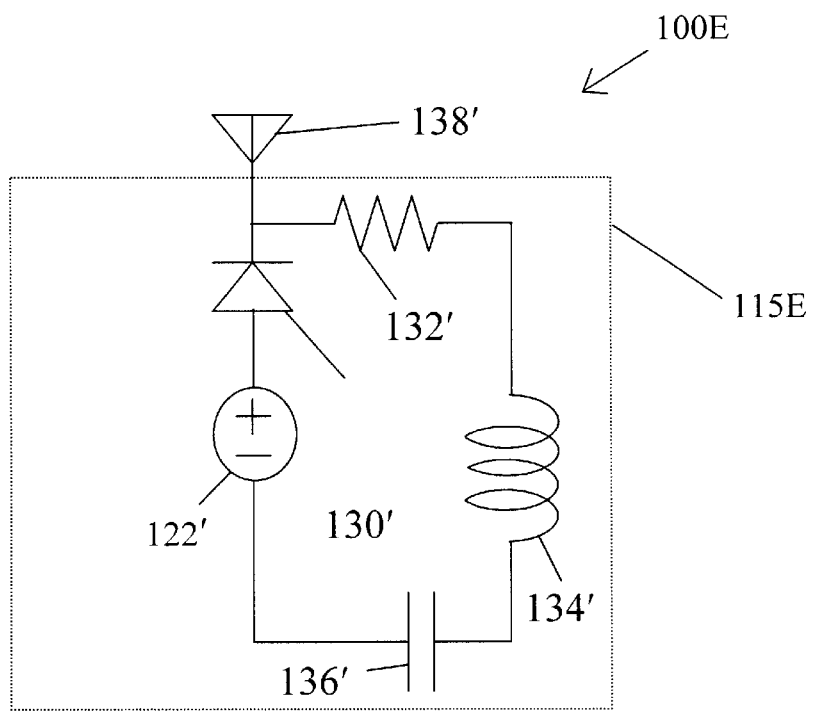

Referring now to FIGS. 2D and 2E in conjunction with FIG. 2B, parallel and series RLC circuits 100D and 100E, respectively, equivalent to the emitter of FIG. 2B are shown. In parallel RLC circuit 100D, a box 115D indicates the collection of parallel components equivalent to diode structure 115. Inside box 115D, a diode 130, a resistor 132, an inductor 134 and a capacitor 136 are arranged in parallel as the equivalent circuit representing diode structure 115 of FIG. 2B. Voltage source 122 is positioned parallel to box 15C, to be consistent with FIG. 2B. A radiating antenna 138 represents antennae 120 and 121. Similarly, in FIG. 2E, serial RLC circuit 100E includes a box 115E indicating the collection of series components equivalent to diode structure 115 of FIG. 2B. A diode 130', a resistor 132', an inductor 134' and a capacitor 136' are positioned in series inside box 115E to represent an equivalent circuit for diode structure 115 with a radiating antenna 138' and a voltage source 122' to provide a voltage across diode 130'.

Continuing to refer to FIGS. 2D and 2E, in each case, the equivalent RLC circuit represents components that can be configured into a resonant circuit which oscillates optimally only over a limited range of frequencies. The component values can be modified, as known to those skilled in the art, to provide response over a desired range of frequencies.

Still referring to FIGS. 2D and 2E, it is noted that the aforedescribed emitters take advantage of the negative differential resistance exhibited by the electron tunneling device of the present invention. By biasing the emitter in the negative differential resistance region, the voltage across the insulating layers of the emitter oscillates at an oscillation frequency. Subsequently, the output antenna radiates at the oscillation frequency. By ensuring that the oscillation is uniform, coherent radiation is achieved. Also, by controlling the oscillation frequency by controlling the voltage bias and by modifying the device dimensions, the frequency of the radiation can be controlled. In this way, the emitters of the present invention can potentially replace currently available optical sources, such as lasers. The radiation emitted by the emitters of the present invention can be readily tailored from the visible frequencies into the far-infrared by scaling the size of the device. Due to the lower resistivity of the metal-oxide combination devices in comparison to semiconductor devices, the emitters of the present invention can be made to operate at higher frequencies than semiconductor oscillators.

For a parallel RLC circuit having a differential resistance $\Delta R$, the oscillation frequency is given by the equation:

$$\omega = \left[\frac{1}{LC} - \frac{1}{(2(\Delta R)C)^2}\right]^{1/2} \tag{3}$$

Several conclusions can be drawn from Equation 3:
1. To achieve high oscillation frequency, the inductance L must be small;
2. For high oscillation frequency, $=\Delta R=$ must be large;
3. For high oscillation frequency, given small L and large $\Delta R$, the value of C must be optimized.
4. For sufficiently small values of C, the (1/LC) term will dominate, and, within certain limits, the magnitude of $=\Delta R=$ will have only a small effect on the oscillation frequency $\omega$.

For a series RLC circuit having a differential resistance $\Delta R$, the oscillation frequency is given by the equation:

$$\omega = \left[\frac{1}{LC} - \frac{(\Delta R)^2}{4L^2}\right]^{1/2} \tag{4}$$

Again, several conclusions can be drawn from Equation 4:
1. To achieve high oscillation frequency, the capacitance C must be small;
2. For high oscillation frequency, $=\Delta R=$ must be close to zero—in other words, the negative differential region of the I-V curve should be as nearly vertical as possible;
3. For high oscillation frequency, given small C and small $\Delta R$, the value of L must be optimized;
4. For sufficiently small values of C, the (1/LC) term will dominate, and, within certain limits, the magnitude of $=\Delta R=$ will have only a small effect on the oscillation frequency $\omega$.

The experimental devices so far fabricated in accordance with the present invention may be best modeled either as parallel or as series RLC circuits. Thus one of the two analyses may be used in optimizing the oscillation frequency of the emitter. In either case, the RLC circuitry acts effectively as integration of a tuning circuit to control the oscillation frequency of the emitter.

The stability of the oscillation frequency can be achieved, for instance, by integrating the emitter into a structure having electromagnetic feedback, such as a Fabry-Perot cavity, or coupled to a distributed Bragg reflector. The reflected electromagnetic energy provides a frequency-dependent feedback voltage that stabilizes the oscillation frequency. The mechanism of the oscillation frequency stabilization using this method is similar to stimulated emission from a gain medium in a laser. Stabilization of the oscillation frequency in the electron tunneling device of the present invention results from the fact that the electron tunneling device can operate both as an emitter and a receiver. The reflected electromagnetic energy is reabsorbed in the electron tunneling device to cause a slight shift in the operating voltage. The shift in the operating voltage changes the value of the differential resistance exhibited by the device, thus causing a shift in the oscillation frequency. In this way, the feedback mechanism works to stabilize the oscillation frequency of the device.

Figure 2F:
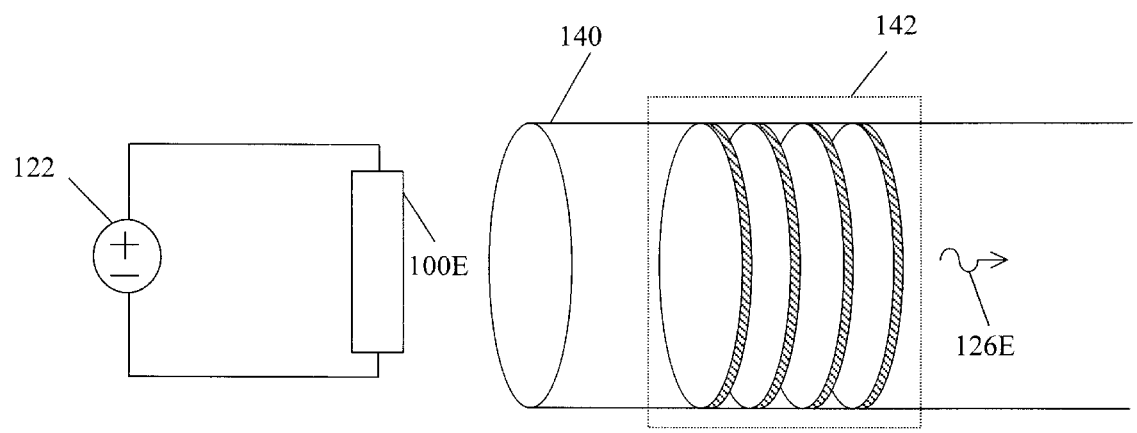

A possible implementation of the aforedescribed feedback mechanism is illustrated in FIG. 2F. FIG. 2F shows an emitter 100F coupled to an optical fiber 140 having an integrated distributed Bragg reflector (DBR), indicated by box 142. DBR 142 is configured to reflect electromagnetic radiation of a particular wavelength, which is partially reabsorbed by the emitter and stabilizes the emission wavelength (i.e., frequency) to a desired value. Thus, the oscillation frequency of emitter 100F is stabilized.

Figure 2G:
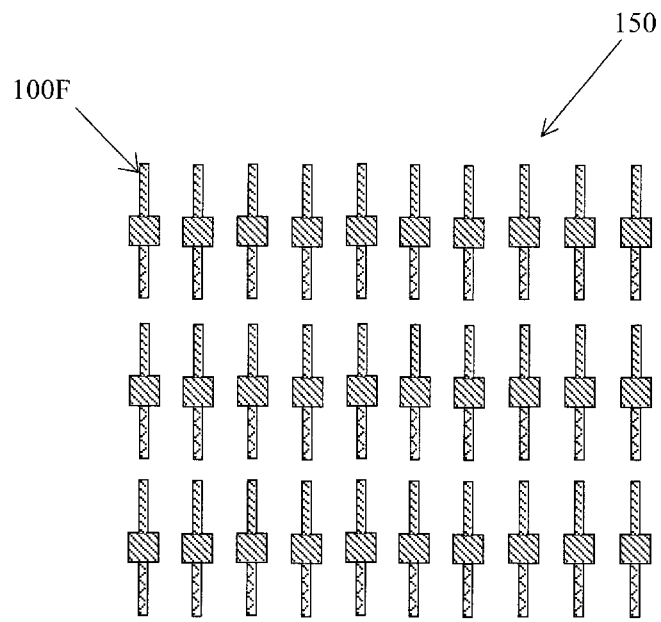

FIG. 2G shows an emitter array 150 designed in accordance with the present invention. Emitter array 150 includes a plurality of emitters 100G, each of which emitters 100G having a narrowband emission characteristic as described for emitter 100B of FIG. 2B (Voltage source 122 of each emitter 100B is not shown for simplicity). For example, each emitter 100G can be configured as detector 100C of FIG. 2C, in which the antennae are integrally formed from the first and second non-insulating layers forming diode structure 115C. Furthermore, at least some of emitters 100G in emitter array 150 can be designed to emit different frequencies of radiation such that emitter array 150 is capable of producing narrowband radiation over a range of frequencies. Still further, emitter array 150 can be configured such that it is capable of emitting radiation over an area larger than the area covered by individual emitters 100G. Moreover, emitter array 150 can be configured with feedback between elements to provide coherent emission across the array.

Returning briefly to FIG. 1A, a possible modification of narrowband detector 10A is to configure antennae 20 and 21 to reflect or absorb the incident electromagnetic energy according to the value of dynamic resistance exhibited by the detector, where the dynamic resistance is inversely proportional to the slope of the I-V curve of the device. Noting that the dynamic resistance exhibited by narrowband detector 10A is a strong function of bias voltage (as shown in FIG. 7E) applied to the device by voltage source 22, it is readily apparent that the incident electromagnetic energy is reflected when the dynamic resistance is very low or very high, and, at intermediate values of dynamic resistance, when the dynamic resistance is matched to the antenna impedance, the electromagnetic energy is absorbed. The absorbed electromagnetic energy is converted to DC electrical power due to the electrical rectification effect of the narrowband detector. Since the electromagnetic energy absorption/reflection can be modulated by changing the applied bias voltage, the narrowband detector of the present invention can function as a modulator by monitoring the electromagnetic energy reflected by the device. Since the narrowband detector of the present invention operates at the frequency of the incident electromagnetic energy, the modulation rate is limited only by the rate at which the bias voltage can be applied to the device. The rate of applied bias voltage is a function of the RC time constant of the device and the signal transmission time, and the RC time constant in the devices of the present invention can be made very small since the capacitance of each of the devices can be made very small by virtue of its dimensions. To further decrease the effective RC value, the antenna can be configured to add an inductive reactance to the diode, compensating the capacitive reactance. Alternatively, the inductive component may be added physically in parallel with the diode.

The antenna structure can also be tailored to absorb 70% or more of the incident electromagnetic energy (see, for example, Z. B. Popovic, et al., "A low-profile broadband antenna for wireless communications," *Sixth IEEE International Symposium on Personal, Indoor and Mobile Radio Communications (PIMRC '95) Wireless: Merging onto the Information Superhighway* (Cat. No. 95TH8135), vol. (xxvii+xxiii+1389), 135-9, vol. 1. Using such an antenna structure, the modulator of the present invention can be made to switch between up to 70% and 0% absorption to achieve a contrast ratio of 2.3 or better. Such a contrast ratio value is acceptable for various applications such as electromagnetic signal modulation. Such modulators may be combined in series to provide greater depth of modulation.

Furthermore, the dimensions of the antenna structure and the electron tunneling device area can be made to range from sub-microns up to hundreds of microns and more, with the result that the wavelength at which the modulation occurs can be selected over a large range. Therefore, by modifying the antenna design and scaling the antenna dimensions, the modulator of the present invention can be made to function over a wide range of wavelengths. In addition, the array of detectors shown in FIG. 1E can be made to function as an array of modulators by proper antenna design. Since the amount of voltage required to bias each modulator in a region of high absorption ranges from a fraction of a volt up to just a few volts, arrays of modulators can be coupled, for example, to a charge-coupled device. In this way, the modulator array can function as a spatial light modulator.

Additional modifications to the modulator can be made. For example, a second antenna can be added to each modulator such that the second antenna, perhaps tuned to a different polarization or wavelength, can be optically addressed to be set to reflect or absorb incident electromagnetic energy. Also, by operating the device in the region of negative differential resistance (i.e., the negative slope region of the resonance peak), a substantial gain can be added to the dc voltage generated in the electronic rectification process. Thus, the modulators of the present invention exhibit extremely fast response, broad region of operation extending from the visible to the far-infrared, low operating voltage and an adequate modulation ratio.

Figure 3A:
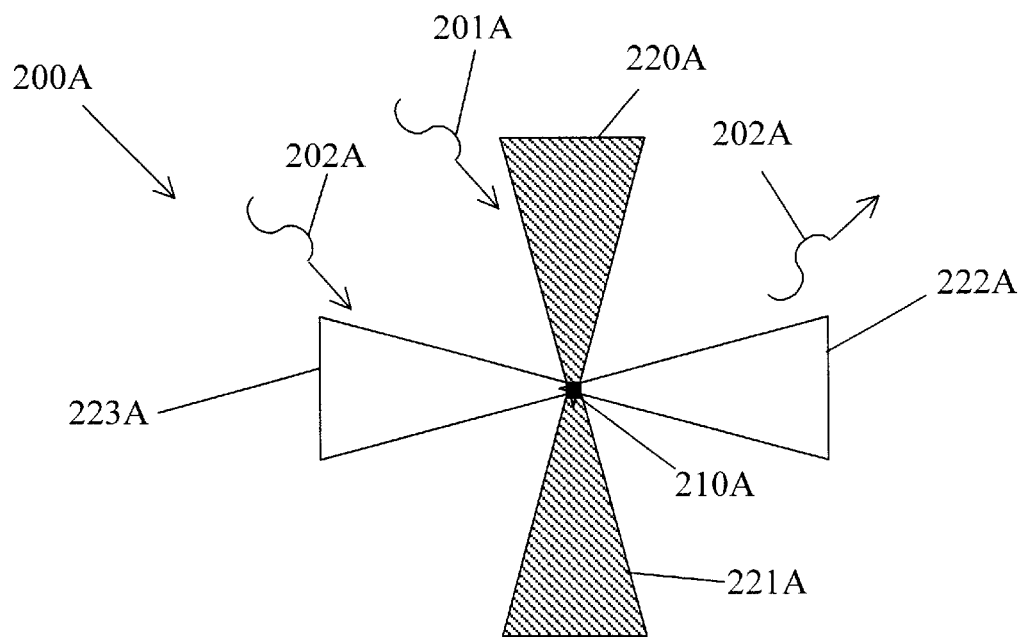
FIGS. 3A and 3B are diagrammatic illustrations of high speed modulators designed in accordance with the present invention.
Figure 3B:
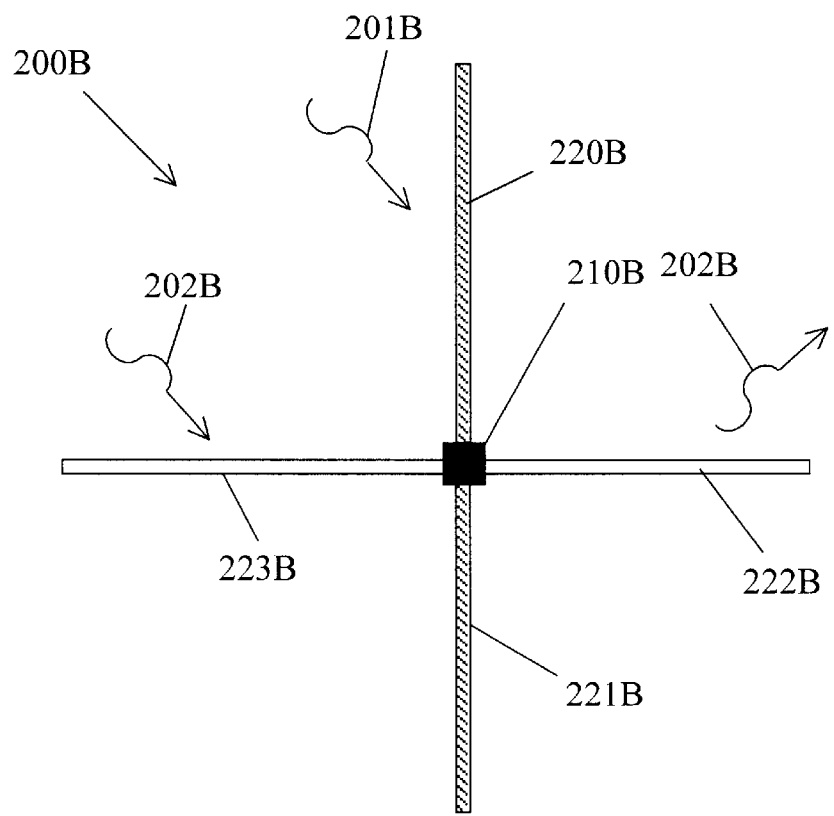

FIGS. 3A and 3B are illustrations of the aforedescribed modulators of the present invention. FIG. 3A illustrates a broadband modulator 200A including broadband, receiving antennae 220A and 221A as well as broadband, modulating antennae 222A and 223A. Receiving antennae 220A and 221A detect a first electromagnetic radiation 201A incident thereon and produces a voltage across a diode structure 210A. Diode structure 210A can be, for example, diode structure 15 shown in FIG. 1A or diode structure 115 as shown in FIG. 2A or 2B. The induced voltage across diode structure 210A subsequently alters the resistance, capacitance, or responsivity of the diode structure, which in turn modifies the absorption characteristics of modulating antennae 222A and 223A. As a result, modulation antennae 222A and 223A act to modulate a second electromagnetic radiation 202A, thus re-emitting second electromagnetic radiation 202A toward an output (not shown) as an output electromagnetic radiation 203A. Consequently, first electromagnetic radiation 201A received at the receiving antenna acts to modulate second electromagnetic radiation 202A which interacts with the modulating antenna to re-emit output electromagnetic radiation 203A.

The detecting and modulating antennas of a modulator of the present invention can be broadband, as shown in FIG. 3A, narrowband, or a combination thereof. FIG. 3B illustrates the use of narrowband antennae for both emitting and receiving antennae. A narrowband modulator 200B includes a diode structure 210B, narrowband, receiving antennae 220B and 221B as well as narrowband, modulating antennae 222B and 223B. Diode structure 210B can again be in the form, for example, of diode structure 15 shown in FIG. 1A or diode structure 115 of FIG. 2A or 2B. Narrowband modulator 200B operates in essentially the same way as broadband modulator 200A of FIG. 3A with a difference in that, since the receiving and modulating antennae are configured to function over a narrow range of frequencies, narrowband modulator 200B works as a modulator only in the narrow range of frequencies. Such a narrowband modulator is useful in certain applications such as optical communications. The modulator of the present invention is configurable to operate as a digital device, in which the receiving antennae produces only discrete, voltage values across the diode structure. Alternatively, the modulator is also configurable as an analog device, in which the receiving antennae is configured to cooperate with the diode structure to produce continuous values of voltages such that the absorption characteristics of the modulating antennae can be modulated over a continuum of absorptivity values.

Figure 4:
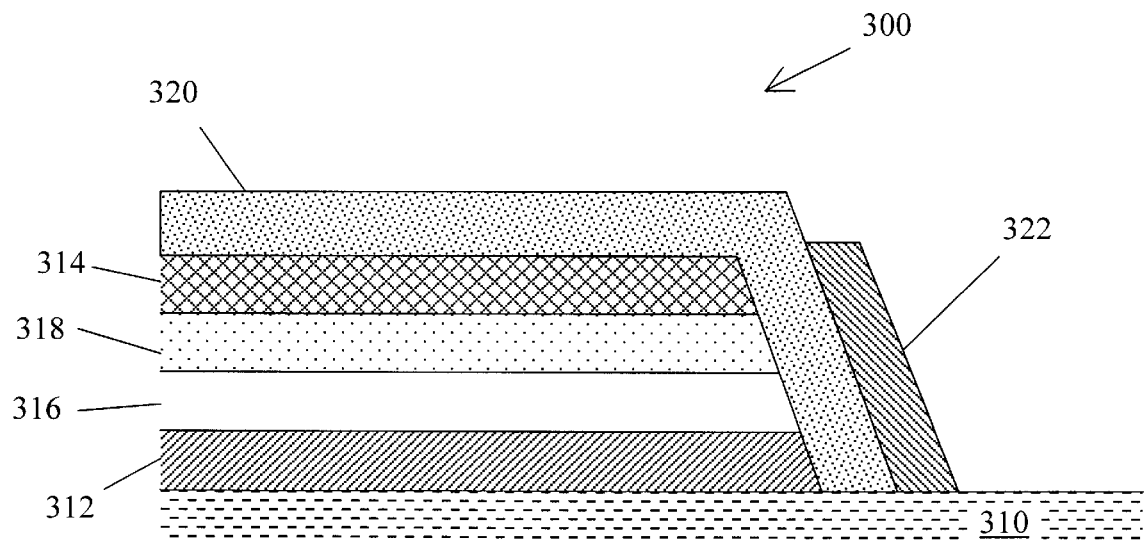
FIG. 4 is a diagrammatic illustration of a field effect transistor designed in accordance with the present invention.

Referring now to FIG. 4, a field effect transistor 300 designed in accordance with the present invention is illustrated. Field effect transistor 300 includes a substrate 310, on which other components are deposited. Field effect transistor 300 further includes a source electrode 312 and a drain electrode 314 with first and second insulating layers 316 and 318, respectively, disposed therebetween. First and second insulating layers 316 and 318 can be replaced, for example, by a multilayer tunneling structure, such as multilayer tunneling structure 116 as described in the context of FIG. 2A. A passivation layer 320 separates the source and drain electrodes and the first and second insulating layers from a gate electrode 322, which is configured to allow the application of a voltage to modulate the potential (not shown) in first and second insulating layers 316 and 318. The modulation of the electric field within the first and second insulating layers is a result of the change in the tunneling probability of electrons flowing through the multilayer oxide between the source and drain electrodes due to the application of the voltage to the gate electrode. Unlike semiconductor transistors, field effect transistor 300 is based on the mechanism of electron tunneling, rather than electron and hole transport in a semiconductor band. Therefore, field effect transistor 300 can operate at much higher frequencies than the presently available semiconductor transistors.

Figure 5:
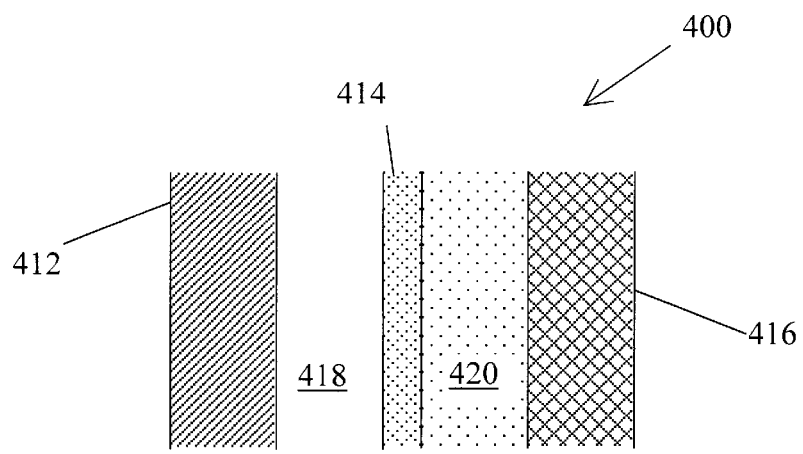
FIG. 5 is a diagrammatic illustration of a junction transistor designed in accordance with the present invention.
Figure 6:
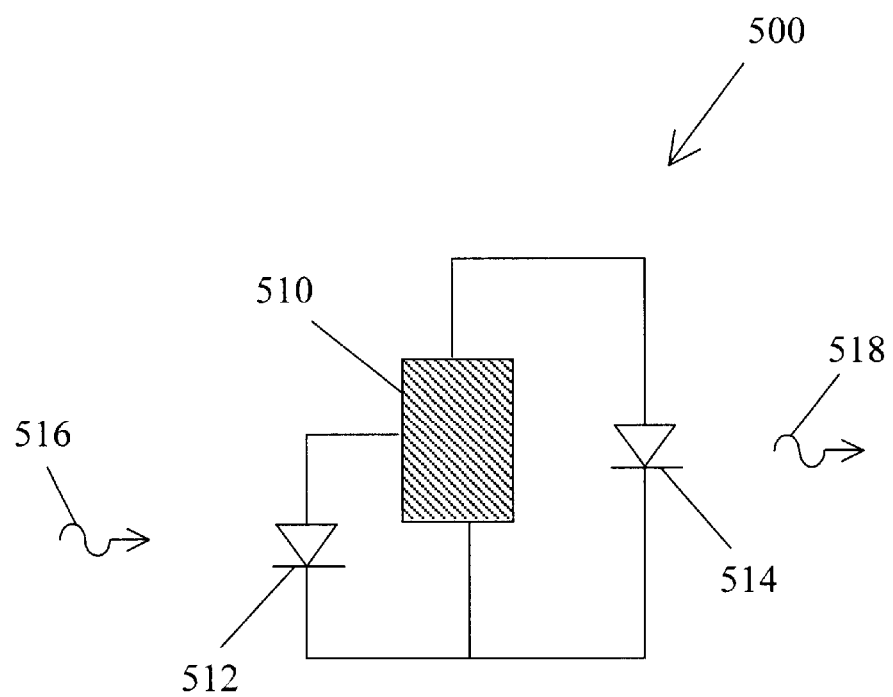
FIG. 6 is a diagrammatic illustration of an optoelectronic amplification element designed in accordance with the present invention.

Turning to FIG. 5, a junction transistor 400 designed in accordance with the present invention is illustrated. Junction transistor 400 includes an emitter electrode 412, a base electrode 414 and a collector electrode 416. A first multilayer tunneling structure 418 is disposed between the emitter and base electrodes. A second multilayer tunneling structure 420 is disposed between the base and collector electrodes. As known to one skilled in the art, junction transistors use bias voltages or currents from an external bias source (not shown) to set the operating point of the transistor, and power to drive the output. These external bias sources are configured to apply voltage, for example, in a common emitter configuration, as a potential at the base-emitter junction and/or as a potential at the collector-emitter junction. For instance, a bias source can be used to apply a voltage across the emitter and base electrodes to control the potential in first multilayer tunneling structure 418 and, consequently, the tunneling probability of electrons from emitter electrode 412 to base electrode 414. Once emitted, electrons tunnel through first multilayer tunneling structure 418, base electrode 414, second multilayer tunneling structure 420 and finally into collector electrode 416 with a given value of collection efficiency. The collection efficiency is a function of the fraction of electrons that tunnel unimpeded through the base. The tunneling probability is determined by the applied voltage to the base, along with other material properties. Again, unlike semiconductor transistors, junction transistor 400 is based on the mechanism of electron tunneling, rather than electron and hole transport in a semiconductor band. Therefore, junction transistor 400 can operate at much higher frequencies than the presently available semiconductor transistors.

A number of the optoelectronic devices described above can be combined to form other optoelectronic components. For example, in FIG. 6, an optoelectronic amplification element 500 is described. Optoelectronic amplification element 500 includes a transistor element, represented by a box 510. Suitable transistor element for use in optoelectronic amplification element 500 are, for example, the aforementioned field effect transistor of FIG. 4 and the junction transistor of FIG. 5. Optoelectronic amplification element further includes a detector 512, which is coupled to a control electrode (the gate or base electrode, depending on the transistor type) of the transistor, and an emitter 514 for generating electromagnetic radiation 518. In optoelectronic amplification element 500 shown in FIG. 6, electromagnetic radiation 516 incident upon the detector generates a voltage at the detector and, subsequently, across the control electrodes of the transistor (for example, across the base and emitter electrodes for a junction transistor). As known to one skilled in the art, transistors use power from an external bias source (not shown) to drive an output, here shown as emitter 514. In this way, the generated voltage across the control electrodes of the transistor in turn alters the bias voltage on emitter 514, which can be tuned to emit substantially more electromagnetic radiation than the amount initially incident upon the device.

Turning now to FIGS. 7A–7E, possible modifications to the high speed optoelectronic devices of the present invention are described. The co-pending application of Eliasson discloses the possibility of using a different metal to form each of the non-insulating layers as well as different amorphous insulators as the first insulating layer and the second layer of material. However, although the electron tunneling device disclosed in Eliasson is suitable for solar energy conversion applications, it is possible to further enhance the flexibility of the Eliasson device by incorporating materials other than metals into the electron tunneling device of Eliasson. Furthermore, the devices of the present invention are especially distinguishable from the electron tunneling devices of the prior art, such as the M-I-M, M-I-M-I-M-I-M and S-I-I-S devices, by the use of resonant tunneling using at least one layer of an amorphous material in the devices. Several such modifications are discussed immediately hereinafter.

Figure 7A:
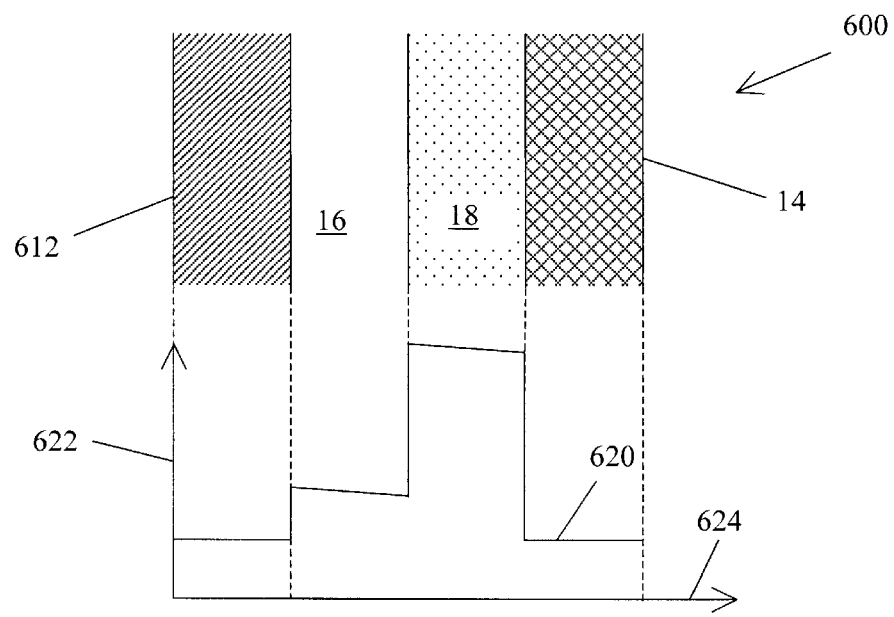
FIG. 7A is a diagrammatic illustration of a high speed optoelectronic device including one semiconductor layer and one metal layer designed in accordance with the present invention.

FIG. 7A illustrates a high speed, optoelectronic device 600. Like Eliasson, optoelectronic device 600 includes first and second non-insulating layers 612 and 14, respectively, with a first insulating layer 16 of an amorphous material and a second layer 18 of a material positioned therebetween. First non-insulating layer 612 and second non-insulating layer 14 are spaced apart such that a given voltage can be provided therebetween. The given voltage can be, for instance, a bias voltage from an external voltage source (not shown) that is directly applied to the first and second non-insulating layers. First insulating layer 16 can be, for example, a native oxide of first non-insulating layer 612. For instance, if a layer of chromium is used as first non-insulating layer 612, the layer of chromium can be oxidized to form a layer of chromium oxide to serve as first insulating layer 16. Other suitable materials include, but are not limited to, silicon dioxide, niobium oxide, titanium oxide, aluminum oxide, zirconium oxide, tantalum oxide, hafnium oxide, yttrium oxide, magnesium oxide, silicon nitride and aluminum nitride. In contrast to Eliasson, first non-insulating layer 612 of optoelectronic device 600 is formed of a semiconductor while second non-insulating layer 14 is formed of a metal. Optoelectronic device 600 is useful in applications such as detectors, in which specific characteristics of the semiconductor positively contribute to the detector efficiency. In addition, optoelectronic device 600 generally exhibits the high nonlinearity and asymmetry in the electron conduction, including resonant tunneling, as demonstrated in the Eliasson device, without the complicated structure of the M-I-M-I-M-I-M device of Suemasu. As an alternative, a semi-metal can be used as first non-insulating layer 612 rather than a semiconductor. A semiconductor in place of one of the metal electrodes allows further tailoring of the diode performance by introducing a band gap in the density of states in one electrode. The density of states, for example, permits enhanced negative differential resistance, resulting from the provided voltage shifting the source of tunneling of electrons through resonant energy levels from regions of high electron concentration (conduction band) to regions of no electron concentration (bandgap). A semiconductor provides electrons that are more confined in energy than does a metal, and therefore the negative differential resistance is enhanced. Furthermore, a semimetal, in place of one of the metal electrodes, provides yet another source of electrons within a confined energy range for the emitting electrode.

Continuing to refer to FIG. 7A, second layer 18 is formed of a predetermined material, which is different from first insulating layer 16 and is configured to cooperate with first insulating layer 16 such that first insulating layer and second layer 18 serve as a transport of electrons between the first and second non-insulating layers. The predetermined material, which forms second layer 18, can be, for example, an amorphous insulator such as, but not limited to, chromium oxide, silicon dioxide, niobium oxide, titanium oxide, aluminum oxide, zirconium oxide, tantalum oxide, hafnium oxide, yttrium oxide, magnesium oxide, silicon nitride, aluminum nitride and a simple air or vacuum gap. Preferably, second layer 18 is formed of a material having a significantly lower or higher work function than that of first amorphous layer such that the device exhibits an asymmetry in the energy band diagram.

Had the optoelectronic device consisted of only the first and second non-insulating layers and the first insulating layer, the device would be essentially equivalent to a prior art M-I-M-based device and would exhibit a given degree of nonlinearity, asymmetry and differential resistance in the transport of electrons. However, the inclusion of second layer 18, surprising and unexpectedly, results in increased degrees of nonlinearity and asymmetry over and above the given degree of nonlinearity and asymmetry while the differential resistance is reduced, with respect to the given voltage. In addition, the use of the semiconductor or semimetal as the first non-insulating layer 612 further enhances the device efficiency. The increase in the nonlinearity and asymmetry and reduction in differential resistance is achieved without resorting to the use of epitaxial growth techniques or crystalline layers of the aforedescribed prior art. The mechanism of this increase is described immediately hereinafter in reference to FIGS. 7B–7E.

Figure 7B:
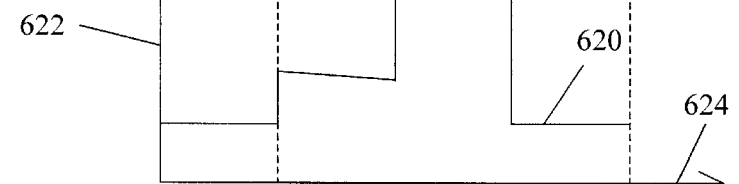
FIGS. 7B–7D are graphs illustrating the schematic conduction band profiles of the high speed optoelectronic device of FIG. 7A for various voltages applied across the high speed optoelectronic device.
Figure 7C:
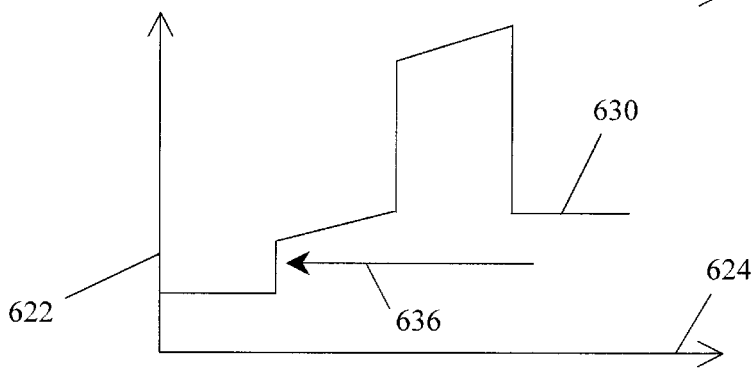
Figure 7D:
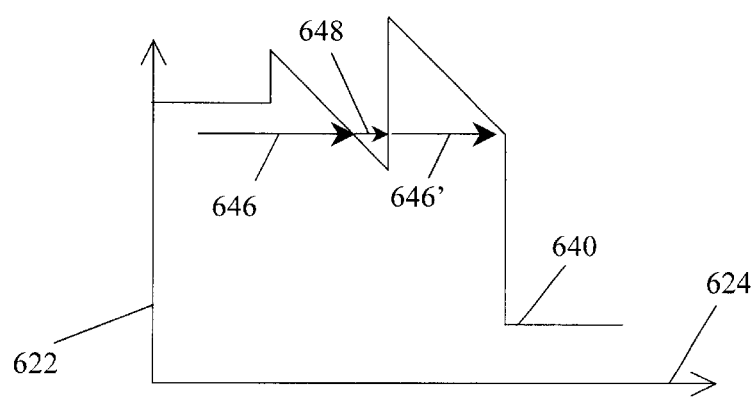
Figure 7E:
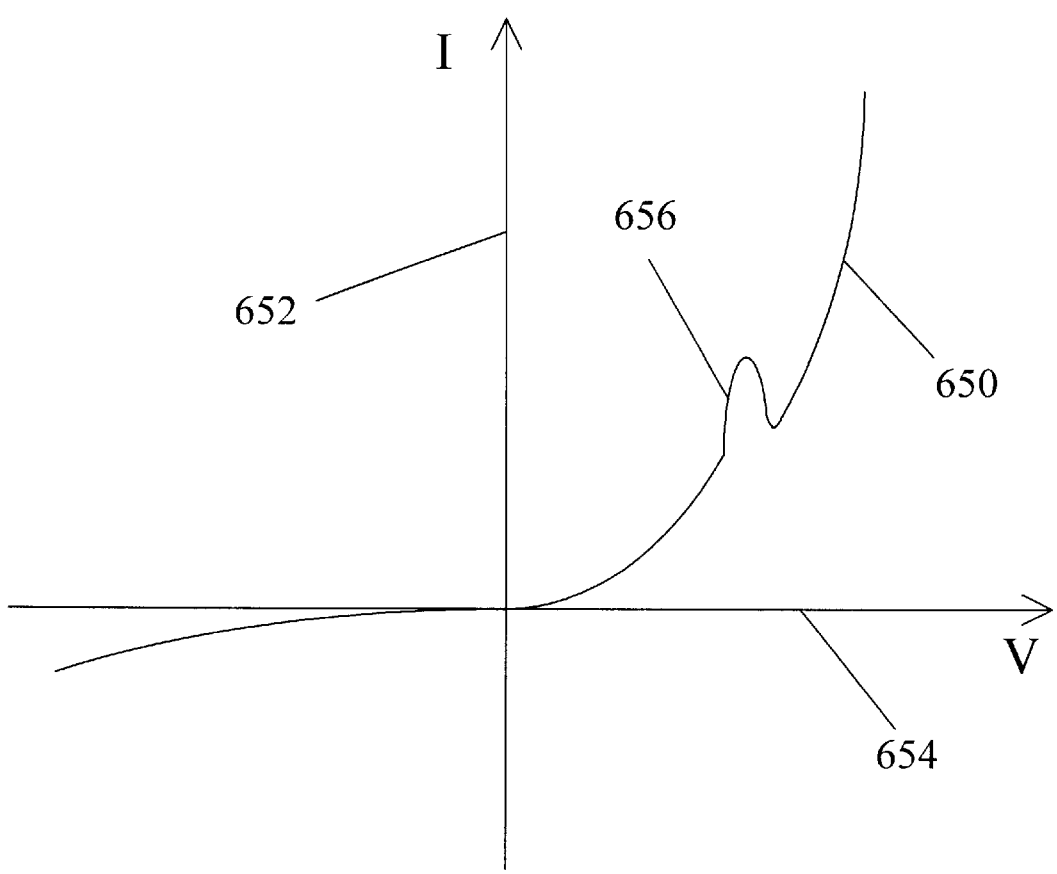
FIG. 7E is a graph of a typical current-voltage curve for the high speed optoelectronic device of FIG. 7A.

Referring to FIGS. 7B–7D in conjunction with FIG. 7A, a schematic of a energy band profile 620 corresponding to electron tunneling device 600 and the changes in the energy band profile due to voltage application are illustrated. Energy band profile 620 includes four regions corresponding to the four layers of electron tunneling device 600. Energy band profile 620 represents the height of the Fermi level in the non-insulating layers and the height of the conduction band edge in first insulating layer 16 and second layer 18 (y-axis 622) as a function of distance (x-axis 624) through optoelectronic device 600 in the absence of provided voltage across the device. FIG. 7C illustrates a first modified energy band profile 630 when a voltage is provided in a reverse direction to M-I-M device 600. The voltage may be provided by, for example, an applied external voltage or an induced voltage due to the incidence of electromagnetic energy. In the case shown in FIG. 7C, the primary mechanism by which electrons travel between the first and second non-insulating layers is tunneling in a reverse direction, represented by an arrow 636. In contrast, when a forward bias voltage is provided, a second modified energy band profile 640 results, as shown in FIG. 7D. In the case of the situation shown in FIG. 7D, tunneling of the electrons occurs along paths 646 and 646', but there now exists a quantum well region through which resonant tunneling occurs, as shown by arrow 648. In the region of resonant tunneling, the ease of transport of electrons suddenly increase, therefore resulting in increased current between the non-insulating layers of electron tunneling device 600.

Continuing to refer to FIG. 7D, the addition of second layer 18 provides a path for electrons to travel through the device by a resonant tunneling rather than the ordinary tunneling process of the prior art M-I-M device. As a result, more current flows between the non-insulating layers of electron tunneling device 600, as compared to the M-I-M device, when a positive voltage is provided while the current flow with a negative voltage provided to the electron tunneling device of the present invention. The presence of resonant tunneling in electron tunneling device 600 therefore results in increased nonlinearity and asymmetry with decreased differential resistance in comparison to the prior art M-I-M device.

A typical I-V curve 650 corresponding to electron tunneling device 600 is shown in FIG. 7E. I-V curve 650 demonstrates that electron tunneling device 600 functions as a diode, where the diode is defined as a two-terminal electronic element. Furthermore, I-V curve 650 is shown to include a resonance peak 656 corresponding to the provided voltage region in which resonant tunneling occurs. The appearance of resonant tunneling in actually fabricated devices of the present invention depends on the precision of the fabrication process. Even when resonance peak 656 is not present, I-V curve 650 exhibits a higher degree of asymmetry and nonlinearity in comparison to the I-V curve of a prior art M-I-M device (for example, as shown in FIG. 1E of Eliasson). In other words, while the presence of a resonance peak in the I-V curve of an electron tunneling device of the present invention may lead to additional advantages in certain applications, such as greatly increased nonlinearity around the resonance peak, the electron tunneling device of the present invention achieves the goal of increased asymmetry and nonlinearity with reduced differential resistance in the current-to-voltage performance even when the averaging effect of the amorphous layer "washes out" the resonance peak. Therefore, electron tunneling device 600 essentially includes all of the advantages of the prior art M-I-M-I-M-I-M device, without the complicated fabrication procedure and the use of exotic materials, and all of the advantages of the prior art SIIS device, without the drawbacks of the use of semiconductor materials as described above. Despite and contrary to the teachings of Suemasu, the electron tunneling device of the present invention is able to achieve increased nonlinearity and asymmetry and decreased differential resistance in the transport of electrons through the device, using readily available metals and insulators in a simple structure that is simply manufactured compared to the more complex manufacturing processes of the prior art.

Figure 8:
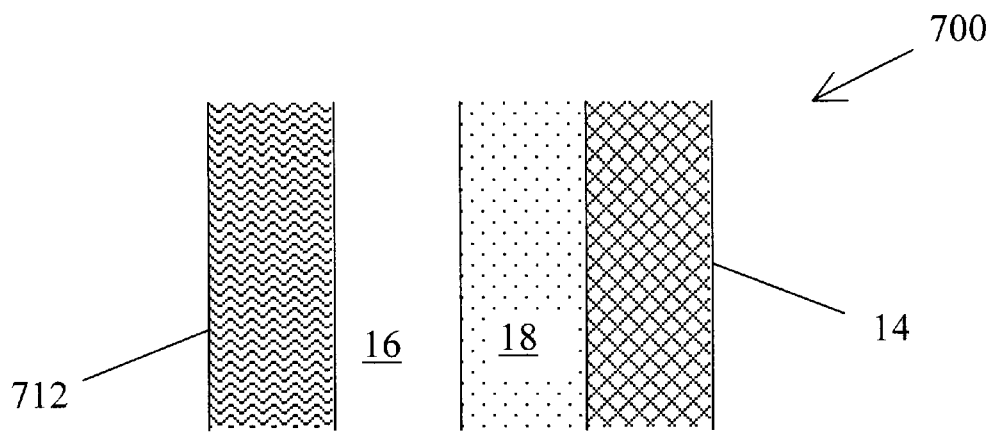
FIG. 8 is a diagrammatic illustration of another high speed optoelectronic device including one superconductor layer and one metal layer designed in accordance with the present invention.
Figure 9:
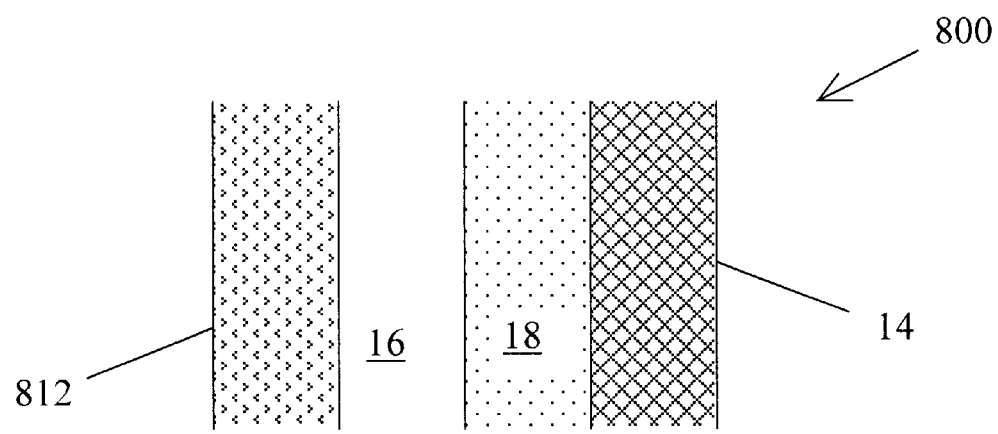
FIG. 9 is a diagrammatic illustration of still another high speed optoelectronic device including one quantum well layer and one metal layer designed in accordance with the present invention.

Referring now to FIGS. 8 and 9 in conjunction with FIG. 7A, more possibilities for materials are described. An optoelectronic device 700 of FIG. 8 includes a modification from the optoelectronic device of FIG. 7A in that first non-insulating layer 712 is now formed of a superconductor. In contrast, an optoelectronic device 800 of FIG. 9 includes a first non-insulating layer 812 in a form of a quantum well. The quantum well is contacted appropriately on its edge or through a barrier layer (not shown), as known to those skilled in the art. The inclusion of the different materials in optoelectronic devices 700 and 800 leads to different conduction band diagrams and, hence, different electron tunneling properties. Optoelectronic devices 700 and 800 do still exhibit resonant tunneling with the appropriate applied voltage, but the exact shape of the I-V curve can be tailored according to the application by adjusting the material properties of the superconductor and the quantum well, respectively. Superconductor layers enhance M-I-I-M device by providing non-linearity at extremely low provided voltages. This is made possible by the relatively small provided voltage required to induce the tunneling of quasi-particles. Furthermore, superconductors can provide lower resistance to the device, which can reduce resistance losses.

In the optoelectronic devices shown in FIGS. 7A-9, it is also possible to have a current flow by the mechanism of hot electron tunneling, in which no external voltage is needed. In hot electron tunneling, electrons tunnel from the first non-insulating layer to the second non-insulating layer, and vice versa, without the application of a voltage across the non-insulating layers. This process is useful in applications where antennas are not used to couple the electric field across the oxide of the diode and the electromagnetic radiation excites electrons directly within the electrodes, and also when the energies of the incident photons are substantially larger than the barrier provided by the insulating multilayer tunneling barrier.

Figure 10A:
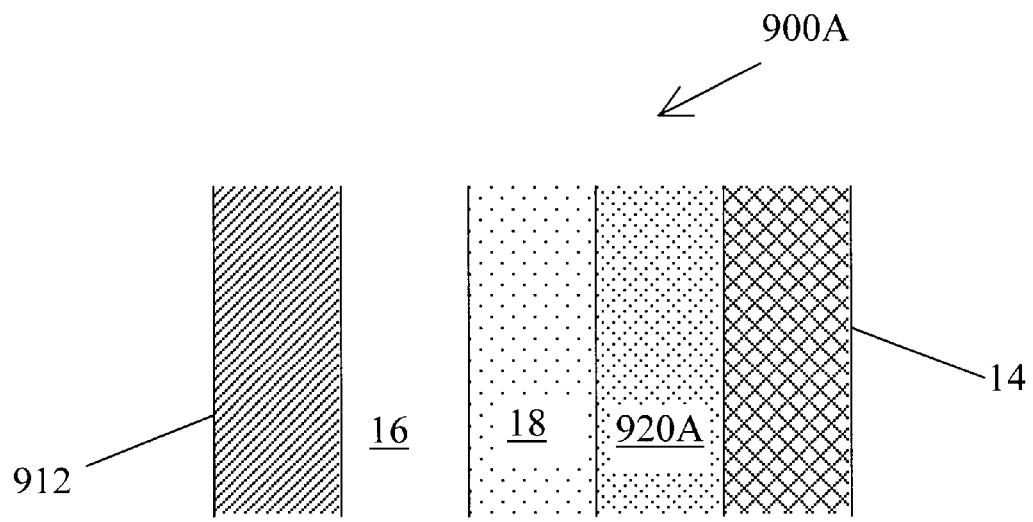
FIGS. 10A and 10B are diagrammatic illustrations of high speed optoelectronic devices shown here to illustrate possible positions of a third layer in the arrangement positioned between the non-insulating layers.
Figure 10B:
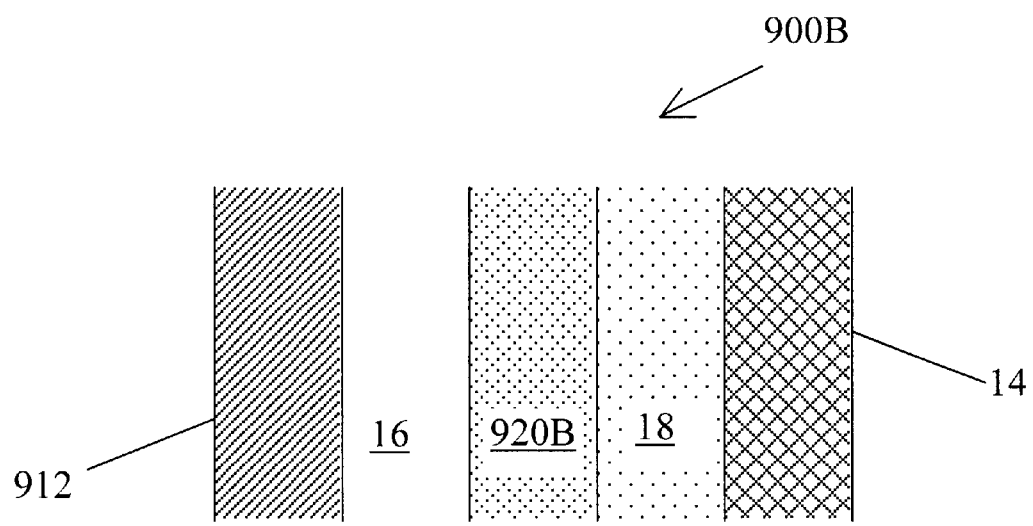

Turning now to FIGS. 10A and 10B, optoelectronic devices including a third layer are illustrated. Optoelectronic devices 900A and 900B each includes a first and second non-insulating layers 912 and 14, respectively, with first and second insulating layers 16 and 18, respectively, positioned therebetween. First and second non-insulating layers can be a metal, semiconductor, semi-metal, superconductor, quantum well, superlattice or a combination thereof. Furthermore, optoelectronic devices 900A and 900B include third layers 920A and 920B, respectively. Third layer 920A is shown to be located between second insulating layer 18 and second non-insulating layer 14 in FIG. 10A, while third layer 920B is shown between first and second insulating layers 16 and 18, respectively. In either case, the third layer is configured such that the nonlinearity and asymmetry in the I-V curve of the respective optoelectronic device are further increased over a device with just the first two insulating layers. The presence of the third layer functions to enhance the electron tunneling between the first and second non-insulating layers by providing an additional path through which the electrons are transported by resonant tunneling. With the application of an appropriate voltage across the first and second non-insulating layers of the device including the third layer, two paths exist through which the electrons can potentially travel by resonant tunneling. By matching the two paths, the electron transport is enhanced in comparison to the optoelectronic device with only one or no resonant tunneling paths, thus increasing the degree of nonlinearity and asymmetry in the I-V curve. In other words, the addition of this third layer further limits the range of applied voltage where appreciable current flows, resulting in increased nonlinearity. The third layer can be, for example, a third insulator, a third non-insulating layer (such as a metal, semiconductor, semi-metal, superconductor, superlattice or a quantum well) formed by known techniques such as sputtering or atomic layer deposition. If the third layer, for example, is a quantum well, the result is discrete allowed energy levels. By matching up the allowed energy level within the quantum well, by a provided voltage, to those produced within the first and second insulating layers, an increased tunneling current between the two non-insulating layers is produced. As with a semiconductor, a superlattice provides electrons that are highly confined in energy, and therefore the negative differential resistance is enhanced.

Figure 11:
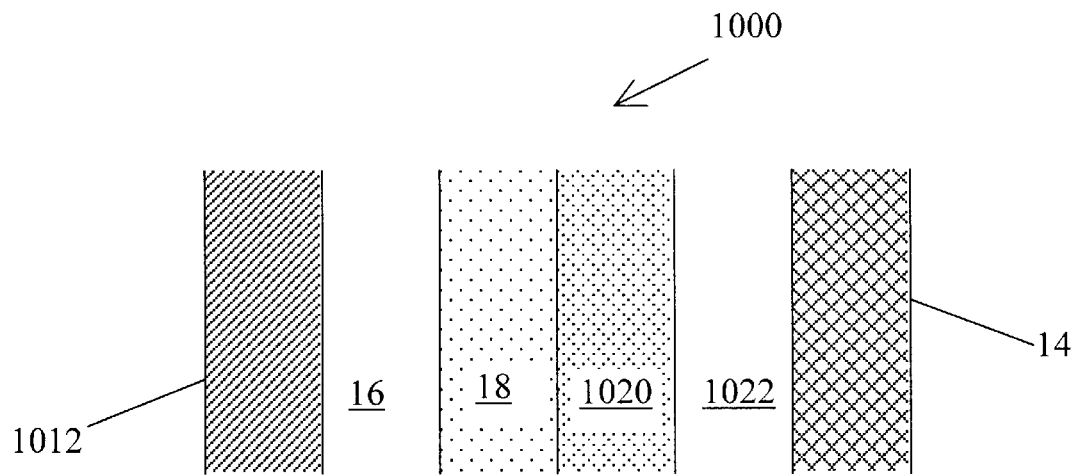
FIG. 11 is a diagrammatic illustration of a high speed optoelectronic device including a fourth layer designed in accordance with the present invention.
Figure 12:
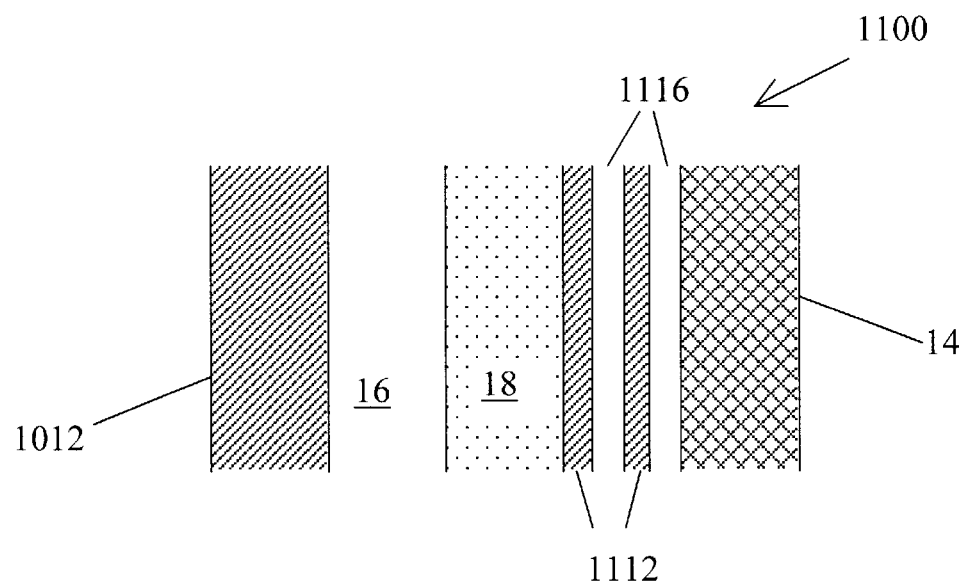
FIG. 12 is a diagrammatic illustration of a high speed optoelectronic device including a superlattice structure designed in accordance with the present invention.

Further extending the idea of additional layers between the non-insulating layers, FIGS. 11 and 12 illustrate optoelectronic devices 1000 and 1100, respectively, with further enhanced resonant tunneling by the addition of a plurality of layers between first and second non-insulating layers. Optoelectronic device 1000 of FIG. 11 includes a third non-insulating layer 1020 and a third insulating layer 1022 between a first non-insulating layer 1012 and second non-insulating layer 14, in addition to first and second insulating layers 16 and 18, respectively. The addition of third non-insulating layer 1020 and third insulating layer 1022 serves to create additional resonance peaks in the I-V curve or to fine tune the location of the original resonance peak in the I-V curve of optoelectronic device 1000. Taking this idea a step further, optoelectronic device 1100 of FIG. 12 includes a plurality of additional, alternating non-insulating layers 1112 and barrier layers 1116 cooperating to form a superlattice structure. The superlattice allows one to perform bandgap engineering and define the energy regions of highly confined electrons. For example, it is possible to develop a region with designed bands of electrons and holes and band gaps. Thereby, we are not limited to the material properties of readily available materials.

Although each of the aforedescribed embodiments have been illustrated with various components having particular respective orientations, it should be understood that the present invention may take on a variety of specific configurations with the various components being located in a wide variety of positions and mutual orientations and still remain within the spirit and scope of the present invention. Furthermore, suitable equivalents may be used in place of or in addition to the various components, the function and use of such substitute or additional components being held to be familiar to those skilled in the art and are therefore regarded as falling within the scope of the present invention. For example, the exact materials used in the aforedescribed devices may be modified while achieving the same result of high speed optoelectronic devices. Also, the various optoelectronic devices described above can be combined to form a high speed optoelectronic integrated circuit, which would have advantages of speed, purely optoelectronic input/output, response from the visible through the far-infrared range, scalability and greater ease of fabrication with less toxic materials in comparison to semiconductor integrated circuits. Furthermore, the present invention can also be used as a basis for other applications such as, but not limited to, memory, charge-coupled device (CCD), electronically-addressed spatial light modulator (EASLM), optically-addressed spatial light modulator (OASLM), high speed electronic components, integrated circuits, millimeter wave detector, heat sensor (long wave infrared detectors), frequency converter, multiplexer, demultiplexer and combinations thereof. For example, an optoelectronic mixer element for simultaneously receiving at least two distinct frequencies of electromagnetic radiation and producing an output signal having a beat frequency, which beat frequency is a combination of said distinct frequencies can be formed. The optoelectronic mixer element includes a multilayer structure (such as the aforedescribed double insulator structure) positioned between a pair of non-insulating layers, which are configured to form an antenna structure for receiving electromagnetic radiation of the two distinct frequencies. The multilayer structure is configured to serve as a transport of electrons between the pair of non-insulating layers as a result of the two distinct frequencies of electromagnetic radiation being received at the antenna structure. The electron transport occurs at least in part by resonant tunneling such that at least a portion of the electromagnetic radiation incident on the antenna is converted to an output signal having the beat frequency. Such an optoelectronic mixer can be used simply to produce an output beat signal having a beat frequency such that the output beat signal is a "mix" of the two input signals. Mixing allows the detection of the lower beat frequencies of high frequency signals that are faster than the detection capabilities of conventional electronic detectors. The element can also be used for heterodyne detection of information encoded on a high frequency carrier signal. The information may be extracted by mixing the high frequency signal with the output from a local oscillator of the same carrier frequency. Therefore, the present examples are to be considered as illustrative and not restrictive, and the invention is not to be limited to the details given herein but may be modified within the scope of the appended claims.

What is claimed is:

1. A detector for detecting electromagnetic radiation incident thereon over a desired range of frequencies, said detector having an output and exhibiting a given responsivity, said detector comprising:
   a voltage source for providing a bias voltage;
   first and second non-insulating layers spaced apart from one another such that the bias voltage can be applied across the first and second non-insulating layers, wherein the first non-insulating layer is formed of a metal, and wherein said first and second non-insulating layers are configured to form an antenna structure for receiving said electromagnetic radiation over the desired range of frequencies and directing said electromagnetic radiation to a specific location within the detector; and
   an arrangement disposed between the first and second non-insulating layers at said specific location and configured to serve as a transport of electrons between and to said first and second non-insulating layers as a result of the electromagnetic radiation being received at the antenna structure, said arrangement including at least a first amorphous insulating layer configured such that using only said first amorphous insulating layer in the arrangement would result in a given value of nonlinearity in said transport of electrons, with respect to said bias voltage, and said arrangement further including a different, second insulating layer disposed directly adjacent to and configured to cooperate with said first amorphous insulating layer that said nonlinearity, with respect to said bias voltage, is increased over and above said given value of nonlinearity by the inclusion of said second insulating layer without the necessity for any additional layers, and said arrangement being further configured such that the transport of electrons includes, at least in part, transport by means of resonant tunneling, and such that at least a portion of the electromagnetic radiation incident on the antenna structure is converted to an electrical signal at the output, said electrical signal having an intensity which depends on the given responsivity.

2. The detector of claim 1 wherein the given responsivity is a function of the bias voltage, and wherein the bias voltage is adjustable such that the given responsivity is consequently adjustable.

3. The detector of claim 1 wherein the antenna structure is approximately 1 micron in length.

4. The detector of claim 1 further comprising an RLC circuit for regulating the desired range of frequencies.

5. The detector of claim 1 wherein the antenna structure is further configured to simultaneously receive two distinct frequencies of electromagnetic radiation such that the electrical signal has a frequency equal to a difference between the two distinct frequencies.

6. A detector array having an output and comprising a plurality of detectors, each one of said plurality of detectors having a detector area, each one of said plurality of detectors being configured for detecting electromagnetic radiation incident on the detector area over a desired range of frequencies and including:
   a voltage source for providing a bias voltage;
   first and second non-insulating layers spaced apart from one another such that the bias voltage can be applied across the first and second non-insulating layers, wherein the first non-insulating layer is formed of a metal, and wherein said first and second non-insulating layers are configured to form an antenna structure for receiving electromagnetic radiation over the desired range of frequencies and directing said electromagnetic radiation to a specific location within each one of said plurality of detectors; and
   an arrangement disposed between the first and second non-insulating layers and configured to serve as a transport of electrons between and to said first and second non-insulating layers as a result of the electromagnetic radiation being received at the antenna structure, said arrangement including at least a first amorphous insulating layer configured such that using only said first amorphous insulating layer in the arrangement would result in a given value of responsivity, with respect to said bias voltage, and said arrangement further including a different, second insulating layer disposed directly adjacent to and configured to cooperate with said first amorphous insulating layer such that said responsivity, with respect to said bias voltage, is increased over and above said given value of responsivity by the inclusion of said second insulating layer without the necessity for any additional layers, said arrangement being further configured such that the transport of electrons includes, at least in part, transport by means of resonant tunneling, and such that at least a portion of the electromagnetic radiation incident on the antenna structure is converted to an electrical signal at the output, said electrical signal having an intensity which depends on the given responsivity, said plurality of detectors being arranged such that the detector array is capable of detecting electromagnetic radiation over a larger spatial area than the detector area of each one of said plurality of detectors.

7. The detector array of claim 6 wherein one of the detectors is configured to detect electromagnetic radiation over a different range of frequencies from the first mentioned, desired range of frequencies of other detectors in the detector array.

8. The detector array of claim 7 wherein each one of the plurality of detectors in the detector array is configured to detect electromagnetic radiation over a distinct range of frequencies such that the detector array is capable of detecting electromagnetic radiation over a wider range of frequencies than the desired range of frequencies of any one of the plurality of detectors in the detector array.

9. An emitter for providing electromagnetic radiation of a desired frequency at an output, said emitter comprising:
a voltage source for providing a bias voltage;
first and second non-insulating layers spaced apart from one another such that the bias voltage can be applied across the first and second non-insulating layers; and
an arrangement disposed between the first and second non-insulating layers and configured to serve as a transport of electrons between and to said first and second non-insulating layers as a result of the bias voltage, said arrangement including at least a first amorphous insulating layer configured such that using only said first amorphous insulating layer in the arrangement would result in a given value of negative differential resistance when the bias voltage is applied across the first and second non-insulating layers, with respect to said bias voltage, and a different, second insulating layer disposed directly adjacent to and configured to cooperate with said first amorphous insulating layer such that said negative differential resistance, with respect to said bias voltage, is decreased below said given value of negative differential resistance by the inclusion of said second insulating layer without the necessity for any additional layers, and said arrangement being further configured such that the transport of electrons includes, at least in part, transport by means of resonant tunneling such that an oscillation in the transport of electrons results, said oscillation having an oscillation frequency equal to the desired frequency due to the negative differential resistance and causing an emission of electromagnetic radiation of the desired frequency at the output.

10. The emitter of claim 9 wherein said first and second non-insulating layers are configured to form an antenna structure for aiding in the emission of said electromagnetic radiation at the output.

11. The emitter of claim 9 further comprising an RLC tuning circuit for regulating the oscillation frequency, the RLC tuning circuit having at least a resistance, an inductance and a capacitance.

12. The emitter of claim 11 wherein the RLC tuning circuit is a parallel RLC circuit.

13. The emitter of claim 11 wherein the RLC tuning circuit is a series RLC circuit.

14. The emitter of claim 11 further comprising a feedback mechanism for stabilizing the oscillation frequency.

15. The emitter of claim 14 wherein the feedback mechanism includes a Fabry-Perot cavity.

16. An emitter array having an output and comprising a plurality of emitters, each one of said plurality of emitters providing electromagnetic radiation at a given frequency and including:
a voltage source for providing a bias voltage;
first and second non-insulating layers spaced apart from one another such that the bias voltage can be applied across the first and second non-insulating layers; and
an arrangement disposed between the first and second non-insulating layers and configured to serve as a transport of electrons between and to said first and second non-insulating layers as a result of the bias voltage, said arrangement including at least a first amorphous insulating layer configured such that using only said first amorphous insulating layer in the arrangement would result in a given value of negative differential resistance when the bias voltage is applied across the first and second non-insulating layers, with respect to the bias voltage, and a different, second insulating layer disposed directly adjacent to and configured to cooperate with said first amorphous insulating layer such that said negative differential resistance, with respect to said bias voltage, is decreased below said given value of negative differential resistance by the inclusion of said second insulating layer without the necessity for any additional layers, and said arrangement being further configured such that the transport of electrons includes, at least in part, transport by means of resonant tunneling, and such that an oscillation in the transport of electrons results, said oscillation having an oscillation frequency equal to the given frequency due to the negative differential resistance and causing an emission of electromagnetic radiation of the given frequency at the output.

17. The emitter array of claim 16 wherein one of the plurality of emitters in the emitter array is configured to provide electromagnetic radiation at a different frequency from the first mentioned, given frequency of others of the plurality of emitters in the emitter array.

18. The emitter array of claim 16 wherein each one of the plurality of emitters in the emitter array is configured to provide electromagnetic radiation at a distinct frequency at the output such that the emitter array is capable of providing electromagnetic radiation over a range of frequencies.

19. An emitter for providing electromagnetic radiation at an output, said emitter comprising:
a voltage source for providing a bias voltage;
a first arrangement including first and second non-insulating layers spaced apart from one another such that said bias voltage can be applied across the first and second non-insulating layers and configured to form an antenna structure for emitting said electromagnetic radiation; and
a second arrangement disposed between the first and second non-insulating layers and configured to serve as a transport of electrons between and to said first and second non-insulating layers as a result of the bias voltage, said arrangement including at least a first amorphous insulating layer configured such that using only said first amorphous insulating layer in the arrangement would result in a given value of negative differential resistance when the bias voltage is applied across the first and second non-insulating layers, with respect to the bias voltage, and a different, second insulating layer disposed directly adjacent to and configured to cooperate with said first amorphous insulating layer such that said negative differential resistance, with respect to said bias voltage, is decreased below said given value of negative differential resistance by the inclusion of said second insulating layer without the necessity for any additional layers, and said arrangement being further configured such that the transport of electrons includes, at least in part, transport by means of hot electron tunneling to cause an emission of electromagnetic radiation at said antenna structure, which antenna structure serves as the output.

20. A modulator for modulating an input electromagnetic radiation incident thereon and providing a modulated electromagnetic radiation at an output, said modulator comprising:

a voltage source for providing a modulation voltage, which modulation voltage is switchable between first and second voltage values;

first and second non-insulating layers spaced apart from one another such that the modulation voltage can be applied across the first and second non-insulating layers, said first and second non-insulating layers being configured to form an antenna structure for absorbing a given fraction of the input electromagnetic radiation with a given value of absorptivity, while a remainder of the input electromagnetic radiation is reflected by the antenna structure, wherein absorptivity is defined as a ratio of an intensity of the given fraction to a total intensity of the input electromagnetic radiation; and an arrangement disposed between the first and second non-insulating layers and configured to serve as a transport of electrons between and to said first and second non-insulating layers as a result of the modulation voltage, said arrangement including at least a first amorphous insulating layer and a different, second insulating layer disposed directly adjacent to and configured to cooperate with the first amorphous insulating layer such that the transport of electrons includes, at least in part, transport by means of resonant tunneling, with respect to the modulation voltage, said arrangement being further configured to cooperate with the first and second non-insulating layers such that the antenna structure exhibits a first value of absorptivity, when modulation voltage of the first voltage value is applied across the first and second non-insulating layers, and exhibits a distinct, second value of absorptivity, when modulation voltage of the second voltage value is applied across the first and second non-insulating layers, causing the antenna structure to reflect a different amount of the input electromagnetic radiation to the output as modulated electromagnetic radiation with a contrast ratio, said contrast ratio being defined as a ratio of said first value of absorptivity to said second value of absorptivity, said arrangement being still further configured such that using only said first amorphous insulating layer in the arrangement would result in a given value of said contrast ratio, with respect to the modulation voltage, while said contrast ratio is increased over and above said given value of contrast ratio by the inclusion of said second insulating layer.

21. The modulator of claim 20 wherein said first and second non-insulating layers are further configured to form a second antenna structure for receiving electromagnetic energy over a desired range of frequencies, directing said electromagnetic radiation to a specific location within the modulator and converting the electromagnetic energy so received into the modulation voltage to be applied across the first and second non-insulating layers at said specific location.

22. A modulator assembly for receiving a modulation signal, modulating an input electromagnetic radiation and providing an output electromagnetic radiation, said modulator assembly comprising:

a voltage source for providing a bias voltage;

first and second non-insulating layers spaced apart from one another such that the bias voltage can be applied across the first and second non-insulating layers, and wherein said first and second non-insulating layers are configured to form a first antenna structure for receiving the modulation signal, directing said modulation signal to a specific location within the modulator assembly and converting the modulation signal so received into a modulation voltage, which modulation voltage is also applied across the first and second non-insulating layers;

an arrangement disposed between the first and second non-insulating layers and configured to serve as a transport of electrons between and to said first and second non-insulating layers as a result of the modulation voltage, said arrangement including at least a first amorphous insulating layer configured such that using only said first amorphous insulating layer in the arrangement would result in a given value of nonlinearity in said transport of electrons, with respect to said bias voltage, and said arrangement further including a different, second insulating layer disposed directly adjacent to and configured to cooperate with said first amorphous insulating layer such that said nonlinearity, with respect to said bias voltage, is increased over and above said given value of nonlinearity by the inclusion of said second insulating layer of material without the necessity for any additional layers, said arrangement being further configured such that the transport of electrons includes, at least in part, transport by means of resonant tunneling; and a second antenna structure having an absorptance value, which absorptance value depends on the aforementioned modulation voltage, wherein said second antenna structure is configured to receive and selectively absorb said input electromagnetic radiation in proportion to the absorptance value so as to produce the output electromagnetic radiation.

23. The modulator assembly of claim 22 wherein said second antenna structure is perpendicular in polarity with respect to the first antenna structure.

24. The modulator assembly of claim 22 wherein said first antenna structure is configured for receiving the modulation signal over a broad range of wavelengths.

25. The modulator assembly of claim 22 wherein said first antenna structure is configured for receiving the modulation signal over a narrow range of wavelengths.

26. A field effect transistor for receiving an external signal, switching an input signal according to the received, external signal and providing an output signal, said external signal being switchable between a first value and a second value, said field effect transistor comprising:

a voltage source for providing a bias voltage;

a diode structure including
  i) a source electrode for receiving said input signal,
  ii) a drain electrode spaced apart from said source electrode such that the bias voltage can be applied across the source and drain electrodes, and
  iii) an arrangement disposed between the source and drain electrodes and configured to serve as a transport of electrons between and to said source and drain electrodes, said arrangement including at least a first amorphous insulating layer configured such that the transport of electrons includes, at least in part, transport by means of resonant tunneling with a given value of a tunneling probability, a shielding layer at least partially surrounding said diode structure; and a gate electrode disposed adjacent to said shielding layer, said gate electrode being configured to receive said external signal and to apply said external signal as said bias voltage across said source and drain electrodes such that, when said first value of external signal is received at the gate electrode, a first signal value is provided as the output signal at the drain electrode and, when said second value of external signal is received at the gate electrode, a second signal value is provided as the output signal at the drain electrode and said output signal exhibits a output ratio, which output ratio is defined as the ratio of the first signal value to the second signal value wherein said arrangement in the diode structure is configured such that, using only said first amorphous insulating layer would result in a first value of output ratio exhibited by the output signal, and wherein said arrangement in the diode structure further includes a different, second insulating layer disposed directly adjacent to and configured to cooperate with said first amorphous insulating layer such that the output signal exhibits a second value of output ratio, which second value of output ratio is higher than said first value of output ratio.

27. A junction transistor comprising:

a voltage source for providing a bias voltage;

an emitter electrode;

a base electrode spaced apart from said emitter electrode such that the bias voltage can be applied across the emitter and base electrodes and, consequently, electrons are emitted by the emitter electrode toward the base electrode;

a first tunneling structure disposed between said emitter and base electrodes and configured to serve as a transport of electrons between and to said emitter and base electrodes, said first tunneling structure including at least a first amorphous insulating layer and a different, second insulating layer disposed directly adjacent to and configured to cooperate with said first amorphous insulating layer such that the transport of electrons includes, at least in part, transport by means of resonant tunneling with a tunneling probability, wherein said tunneling probability depends on said bias voltage;

a collector electrode spaced apart from said base electrode; and a second tunneling structure disposed between said base and collector electrodes and configured to serve as a transport, between said base and collector electrodes, of at least a portion of said electrons emitted by said emitter electrode such that the portion of the electrons is collected by said collector electrode with a collection efficiency, wherein said transport of electrons includes, at least in part, transport by means of tunneling.

28. An optoelectronic amplification element for receiving an input electromagnetic radiation, which input electromagnetic radiation has an input intensity, and producing an output electromagnetic radiation, which output electromagnetic radiation has an output intensity, said optoelectronic amplification element comprising:

A) a detector for detecting an input electromagnetic radiation incident thereon, said detector including:
  1) a first voltage source for providing a first bias voltage;
  2) first and second non-insulating layers spaced apart from one another such that the first bias voltage can be applied across the first and second non-insulating layers, wherein the first non-insulating layer is formed of a metal, and wherein said first and second non-insulating layers are configured to form an antenna structure for receiving said input electromagnetic radiation and directing said electromagnetic radiation to a specific location within the detector, and
  3) an arrangement disposed between the first and second non-insulating layers at said specific location and configured to serve as a transport of electrons between and to said first and second non-insulating layers as a result of the input electromagnetic radiation being received at the antenna structure, said arrangement including at least a first amorphous insulating layer and a different, second insulating layer disposed directly adjacent to and configured to cooperate with said first amorphous insulating layer such that the transport of electrons includes, at least in part, transport by means of resonant tunneling, and such that at least a portion of the electromagnetic radiation incident on the antenna structure is converted to an electrical signal switchable between at least a first value and a second value:

B) a field effect transistor for receiving said electrical signal, switching an input signal according to the received, electrical signal and providing a modulation signal, said field effect transistor including:
  1) a second voltage source for providing a second bias voltage;
  2) a diode structure including
    a) a source electrode for receiving said input signal,
    b) a drain electrode spaced apart from said source electrode such that the second bias voltage can be applied across the source and drain electrodes, and
    c) an arrangement disposed between the source and drain electrodes and configured to serve as a transport of electrons between and to said source and drain electrodes, said arrangement including at least a first amorphous insulating layer and a different, second insulating layer disposed directly adjacent to and configured to cooperate with said first amorphous insulating layer configured such that the transport of electrons includes, at least in part, transport by means of resonant tunneling with a given value of a tunneling probability,
  3) a shielding layer at least partially surrounding said diode structure; and
  4) a gate electrode disposed adjacent to said shielding layer, said gate electrode being configured to receive said electrical signal and to apply said electrical signal as said second bias voltage across said source and drain electrodes such that, when said first value of electrical signal is received at the gate electrode, a first signal value is provided as the modulation signal at the drain electrode and, when said second value of electrical signal is received at the gate electrode, a second signal value is provided as the modulation signal at the drain electrode: and C) an emitter for providing output electromagnetic radiation, said emitter including:
  1) first and second non-insulating layers spaced apart from one another, said first non-insulating layer being configured to receive said modulation signal and to apply said modulation signal as a third bias voltage across the first and second non-insulating layers; and
  2) an arrangement disposed between the first and second non-insulating layers and configured to serve as a transport of electrons between and to said first and second non-insulating layers as a result of the third bias voltage, said arrangement being further configured to exhibit a given value of negative differential resistance when the third bias voltage is applied across the first and second non-insulating layers, said arrangement including at least a first amorphous insulating layer and a different, second insulating layer disposed directly adjacent to and configured to cooperate with said first amorphous insulating layer configured such that the transport of electrons includes, at least in part, transport by means of resonant tunneling, and such that an oscillation in the transport of electrons results due to the negative differential resistance and causes an emission of said output electromagnetic radiation, wherein said output intensity of said output electromagnetic radiation is substantially larger than said input intensity of said input electromagnetic radiation.

29. An optoelectronic mixer element for simultaneously receiving at least two distinct frequencies of electromagnetic radiation and producing an output signal having a beat frequency, which beat frequency is a combination of said two distinct frequencies, said optoelectronic mixer element comprising:

a voltage source for providing a bias voltage;

first and second non-insulating layers spaced apart from one another such that the bias voltage can be applied across the first and second non-insulating layers, wherein the first non-insulating layer is formed of a metal, and wherein said first and second non-insulating layers are configured to form an antenna structure for receiving electromagnetic radiation of said two distinct frequencies and directing said electromagnetic radiation to a specific location within the optoelectronic mixer element; and an arrangement disposed between the first and second non-insulating layers at said specific location and configured to serve as a transport of electrons between and to said first and second non-insulating layers as a result of the two distinct frequencies of electromagnetic radiation being received at the antenna structure, said arrangement including at least a first amorphous insulating layer and a different, second insulating layer disposed directly adjacent to and configured to cooperate with said first amorphous insulating layer such that the transport of electrons includes, at least in part, transport by means of resonant tunneling, and such that at least a portion of the electromagnetic radiation incident on the antenna structure is converted to the output signal having said beat frequency.

30. An electron tunneling device comprising:

a) first and second non-insulating layers spaced apart from one another such that a given voltage can be applied across the first and second non-insulating layers, the first non-insulating layer being formed of a semiconductor material and the second non-insulating layer being formed of a metal; and b) an arrangement disposed between the first and second non-insulating layers and configured to serve as a transport of electrons between and to said first and second non-insulating layers, said arrangement including i) a first amorphous insulating layer such that using only said first amorphous insulating layer would result in a given degree of nonlinearity in said transport of electrons, with respect to said given voltage, and ii) a different, second insulating layer disposed directly adjacent to and configured to cooperate with said first amorphous insulating layer such that the transport of electrons includes, at least in part, transport by means of tunneling, and such that said nonlinearity in the transport of electrons, with respect to said given voltage, is increased over and above said given degree of nonlinearity by the inclusion of said second insulating layer without the necessity for any additional layers.

31. The electron tunneling device of claim 30 wherein said second insulating layer is formed of an amorphous insulator.

32. The electron tunneling device of claim 31 wherein said first layer of amorphous material and said second insulating layer are formed of different, amorphous insulators.

33. The electron tunneling device of claim 30 wherein said second insulating layer is formed of a crystalline insulator.

34. The electron tunneling device of claim 30 wherein the transport of electrons includes, at least in part, transport by means of resonant tunneling.

35. The electron tunneling device of claim 30 wherein the transport of electrons includes, at least in part, transport by means of sequential tunneling.

36. The electron tunneling device of claim 30 wherein the first and second non-insulating layers, the first amorphous insulating layer and the second insulating layer cooperate to form a diode structure.

37. The electron tunneling device of claim 36 wherein the diode structure is approximately 0.1 micron in length.

38. The electron tunneling device of claim 30 wherein the first and second non-insulating layers are configured to form an antenna structure for receiving electromagnetic energy, directing said electromagnetic radiation to a specific location within the electron tunneling device and converting the electromagnetic energy so received into said given voltage applied across the first and second non-insulating layers at said specific location.

39. The electron tunneling device of claim 38 wherein the antenna structure is in a form of a bowtie antenna.

40. The electron tunneling device of claim 38 wherein the antenna structure is designed to receive electromagnetic energy in a predetermined range of frequencies.

41. The electron tunneling device of claim 38 wherein said predetermined range of frequencies includes frequencies of visible electromagnetic radiation.

42. The electron tunneling device of claim 40 wherein the antenna structure is approximately 1 micron in length.

43. The electron tunneling device of claim 30 wherein said arrangement is further configured such that using only said first amorphous insulating layer would result in a given degree of asymmetry in said transport of electrons, with respect to said given voltage, and wherein said second insulating layer is selected to increase said asymmetry in the transport of electrons between and to said non-insulating layers, with respect to said given voltage, over and above said given degree of asymmetry.

44. The electron tunneling device of claim 30 wherein said arrangement is further configured such that using only said first amorphous insulating layer would result in a given value of differential resistance in said transport of electrons, with respect to said given voltage, and wherein said second insulating layer is selected to decrease said differential resistance in the transport of electrons between and to said non-insulating layers, with respect to said given voltage, below said given value of differential resistance.

45. The electron tunneling device of claim 30 further comprising a third non-insulating layer positioned outside of the first and second non-insulating layers, said third non-insulating layer cooperating with the first and second non-insulating layers, the first amorphous insulating layer and the second insulating layer to form a transistor structure.

46. The electron tunneling device of claim 45 further comprising a separation layer for segregating the third non-insulating layer from the first and second non-insulating layers.

47. The electron tunneling device of claim 30 wherein the arrangement is further configured to result in a negative differential resistance in said transport of electrons for a predetermined range of voltage values for said given voltage.

48. An electron tunneling device comprising:
  a) first and second non-insulating layers spaced apart from one another such that a given voltage can be applied across the first and second non-insulating layers, the first non-insulating layer being formed of a semiconductor material and second non-insulating layer being formed of a metal; and
  b) an arrangement disposed between the first and second non-insulating layers and configured to serve as a transport of electrons between and to said first and second non-insulating layers, said arrangement including
    i) a first amorphous insulating layer such that using only said first amorphous insulating layer would result in a given degree of asymmetry in said transport of electrons, with respect to said given voltage, and
    ii) a different, second insulating layer disposed directly adjacent to and configured to cooperate with said first amorphous insulating layer such that the transport of electrons includes, at least in part, transport by means of tunneling, and such that said asymmetry in the transport of electrons, with respect to said given voltage, is increased over and above said given degree of asymmetry by the inclusion of said second insulating layer without the necessity for any additional layers.

49. The electron tunneling device of claim 48 wherein said arrangement is further configured such that using only said first amorphous insulating layer would result in a given value of differential resistance in said transport of electrons, with respect to said given voltage, and wherein said second insulating layer is selected to decrease said differential resistance in the transport of electrons between and to said non-insulating layers, with respect to said given voltage, below said given value of differential resistance.

50. The electron tunneling device of claim 49 wherein the arrangement is further configured to result in a negative differential resistance in said transport of electrons for a predetermined range of voltage values for said given voltage.

51. An electron tunneling device comprising:
  a) first and second non-insulating layers spaced apart from one another such that a given voltage can be applied across the first and second non-insulating layers, the first non-insulating layer being formed of a semiconductor material and the second non-insulating layer being formed of a metal; and
  b) an arrangement disposed between the first and second non-insulating layers and configured to serve as a transport of electrons between and to said first and second non-insulating layers, said arrangement including
    i) a first amorphous insulating layer such that using only said first amorphous insulating layer would result in a given value of differential resistance in said transport of electrons, with respect to said given voltage, and
    ii) a different, second insulating layer disposed directly adjacent to and configured to cooperate with said first amorphous insulating layer such that the transport of electrons includes, at least in part, transport by means of tunneling, and such that said differential resistance in the transport of electrons, with respect to said given voltage, is decreased below said given value of differential resistance by the inclusion of said second insulating layer without the necessity for any additional layers.

52. The electron tunneling device of claim 51 wherein said arrangement is further configured such that using only said first amorphous insulating layer would result in a given degree of nonlinearity and a given degree of asymmetry in said transport of electrons, with respect to said given voltage, and wherein said second insulating layer is selected to increase said nonlinearity and said asymmetry in the transport of electrons between and to said non-insulating layers, with respect to said given voltage, over and above said given degree of nonlinearity and said given degree of asymmetry.

53. The electron tunneling device of claim 51 wherein the arrangement is further configured to result in a negative differential resistance in said transport of electrons for a predetermined range of voltage values for said given voltage.

54. An electron tunneling device comprising:
  a) first and second non-insulating layers spaced apart from one another such that a given voltage can be applied across the first and second non-insulating layers, the first non-insulating layer being formed of a semi-metal and the second non-insulating layer being formed of a metal; and
  b) an arrangement disposed between the first and second non-insulating layers and configured to serve as a transport of electrons between and to said first and second non-insulating layers, said arrangement including
    i) a first amorphous insulating layer such that using only first amorphous insulating layer would result in a given degree of nonlinearity in said transport of electrons, with respect to said given voltage, and
    ii) a different, second insulating layer disposed directly adjacent to and configured to cooperate with said first amorphous insulating layer such that the transport of electrons includes, at least in part, transport by means of tunneling, and such that said nonlinearity in the transport of electrons, with respect to said given voltage, is increased over and above said given degree of nonlinearity by the inclusion of said second insulating layer without the necessity for any additional layers.

55. An electron tunneling device comprising:
  a) first and second non-insulating layers spaced apart from one another such that a given voltage can be applied across the first and second non-insulating layers, the first non-insulating layer being formed of a superconductor and the second non-insulating layer being formed of a metal; and
  b) an arrangement disposed between the first and second non-insulating layers and configured to serve as a transport of electrons between and to said first and second non-insulating layers, said arrangement including i) a first amorphous insulating layer such that using only said first amorphous insulating layer would result in a given degree of nonlinearity in said transport of electrons, with respect to said given voltage, and ii) a different, second insulating layer disposed directly adjacent to and configured to cooperate with said first amorphous insulating layer such that the transport of electrons includes, at least in part, transport by means of tunneling, and such that said nonlinearity in the transport of electrons, with respect to said given voltage, is increased over and above said given degree of nonlinearity by the inclusion of said second insulating layer without the necessity for any additional layers.

56. An electron tunneling device comprising:

a) first and second non-insulating layers spaced apart from one another such that a given voltage can be applied across the first and second non-insulating layers, the first non-insulating layer forming a quantum well and the second non-insulating layer being formed of a metal; and b) an arrangement disposed between the first and second non-insulating layers and configured to serve as a transport of electrons between and to said first and second non-insulating layers, said arrangement including i) a first amorphous insulating layer such that using only said first amorphous insulating layer would result in a given degree of nonlinearity in said transport of electrons, with respect to said given voltage, and ii) a different, second insulating layer disposed directly adjacent to and configured to cooperate with said first amorphous insulating layer such that the transport of electrons includes, at least in part, transport by means of tunneling, and such that said nonlinearity in the transport of electrons, with respect to said given voltage, is increased over and above said given degree of nonlinearity by the inclusion of said second insulating layer without the necessity for any additional layers.

57. An electron tunneling device comprising:

a) first and second non-insulating layers spaced apart from one another such that a given voltage can be applied across the first and second non-insulating layers; and b) an arrangement disposed between the first and second non-insulating layers and configured to serve as a transport of electrons between and to said first and second non-insulating layers, said arrangement including i) a first amorphous insulating layer such that using only said first amorphous insulating layer would result in a given degree of nonlinearity in said transport of electrons, with respect to said given voltage, ii) a different, second insulating layer disposed directly adjacent to and configured to cooperate with said first amorphous insulating layer such that the transport of electrons includes, at least in part, transport by means of tunneling, and such that said nonlinearity in the transport of electrons, with respect to said given voltage, is increased over and above said given degree of nonlinearity by the inclusion of said second insulating layer without the necessity for any additional layers, and iii) a third layer of material configured to further increase said nonlinearity in the transport of electrons, with respect to said given voltage, over and above said given degree of nonlinearity.

58. The electron tunneling device of claim 57 wherein said first non-insulating layer is formed of a metal.

59. The electron tunneling device of claim 57 wherein said first non-insulating layer is formed of a semiconductor.

60. The electron tunneling device of claim 57 wherein said first non-insulating layer is formed of a semi-metal.

61. The electron tunneling device of claim 57 wherein said first non-insulating layer is formed of a superconductor.

62. The electron tunneling device of claim 57 wherein said first non-insulating layer forms a quantum well.

63. The electron tunneling device of claim 57 wherein said second insulating layer is formed of an amorphous insulator.

64. The electron tunneling device of claim 63 wherein said first layer of amorphous material and said second insulating layer are formed of different, amorphous insulators.

65. The electron tunneling device of claim 57 wherein said second insulating layer is formed of a crystalline insulator.

66. The electron tunneling device of claim 57 wherein said third layer of material is positioned directly adjacent to the second insulating layer.

67. The electron tunneling device of claim 66 wherein the third layer of material is disposed between said first amorphous insulating layer and said second insulating layer.

68. The electron tunneling device of claim 66 wherein said third layer of material is formed of an amorphous insulator.

69. The electron tunneling device of claim 66 wherein said third layer of material is formed of a crystalline insulator.

70. The electron tunneling device of claim 66 wherein said third layer of material is formed of a non-insulating material.

71. The electron tunneling device of claim 70 wherein said third layer of material is formed of a metal.

72. The electron tunneling device of claim 70 wherein said third layer of material is formed of a semiconductor.

73. The electron tunneling device of claim 70 wherein said third layer of material is formed of a semi-metal.

74. The electron tunneling device of claim 70 wherein said third layer of material is formed of a superconductor.

75. The electron tunneling device of claim 70 wherein said third layer of material forms a quantum well.

76. The electron tunneling device of claim 57 further comprising a plurality of non-insulating and insulating layers additionally positioned between the first and second non-insulating layers.

77. The electron tunneling device of claim 76 wherein the plurality of non-insulating and insulating layers includes:

i) a first amorphous insulator, ii) a different, second amorphous insulator positioned adjacent to said first amorphous insulator, iii) an electrically conductive layer positioned adjacent to said second amorphous insulator, and iv) a third amorphous insulator positioned adjacent to said electrically conductive layer.

78. The electron tunneling device of claim 77 wherein the electrically conductive layer forms a quantum well.

79. The electron tunneling device of claim 76 wherein the plurality of non-insulating and insulating layers are configured to form a superlattice.

80. An electron tunneling device comprising:

a) a first arrangement including first and second non-insulating layers spaced apart from one another such that a given voltage can be applied across the first and second non-insulating layers and configured to form an antenna; and b) a second arrangement disposed between the first and second non-insulating layers and configured to serve as a transport of electrons between and to said first and second non-insulating layers, said arrangement including i) a first amorphous insulating layer such that using only said first amorphous insulating layer would result in a given degree of nonlinearity in said transport of electrons, with respect to said given voltage, and ii) a different, second insulating layer disposed directly adjacent to and configured to cooperate with said first amorphous insulating layer such that the transport of electrons includes, at least in part, transport by means of hot electron tunneling, and such that said nonlinearity in the transport of electrons, with respect to said given voltage, is increased over and above said given degree of nonlinearity by the inclusion of said second insulating layer without the necessity for any additional layers.

* * * * *